(12) United States Patent
Miki et al.

(10) Patent No.: US 7,102,935 B2
(45) Date of Patent: Sep. 5, 2006

(54) SEMICONDUCTOR MEMORY DEVICE DRIVEN WITH LOW VOLTAGE

(75) Inventors: Takeo Miki, Hyogo (JP); Yasuhiko Tsukikawa, Hyogo (JP); Shinji Tanaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/972,537

(22) Filed: Oct. 26, 2004

(65) Prior Publication Data

US 2005/0088881 A1   Apr. 28, 2005

(30) Foreign Application Priority Data

Oct. 28, 2003   (JP) ............................... 2003-367660

(51) Int. Cl.
*G11C 5/14* (2006.01)
*G11C 7/00* (2006.01)
*G11C 8/00* (2006.01)

(52) U.S. Cl. ..................... 365/189.09; 365/230.06; 365/189.05

(58) Field of Classification Search .......... 365/189.09; 326/26

See application file for complete search history.

(56) References Cited

U.S. PATENT DOCUMENTS 5,917,765 A * 6/1999 Morishita et al. ........... 365/201
6,449,208 B1 * 9/2002 Kono et al. ................. 365/226
6,574,159 B1 * 6/2003 Ohbayashi et al. .......... 365/201
6,661,729 B1 * 12/2003 Yamasaki .................... 365/226
6,777,279 B1 * 8/2004 Hashimoto et al. .......... 438/197
6,930,940 B1 * 8/2005 Haraguchi ................... 365/203

FOREIGN PATENT DOCUMENTS

| JP | 8-55480 | 2/1996 |
|---|---|---|
| JP | 9-198867 | 7/1997 |
| JP | 11-96758 | 4/1999 |
| JP | 2000-21170 | 1/2000 |
| JP | 2002-216478 | 8/2002 |

* cited by examiner

*Primary Examiner*—Amir Zarabian
*Assistant Examiner*—Anthan Tran
(74) *Attorney, Agent, or Firm*—McDermott Will & Emery LLP

(57) ABSTRACT

Independent power supply systems are provided for a peripheral circuit other than a column decoder, an array-relevant circuit, and a column decoder respectively, so that a peripheral power supply voltage, an array power supply voltage, and a column decoder power supply voltage generated independently of each other are supplied to the peripheral circuit, the array-relevant circuit, and the column decoder as an operating power supply voltage, respectively. Preferably, the column decoder power supply voltage during normal operation is set as an intermediate voltage between the peripheral power supply voltage and the array power supply voltage. Thus, an array configuration suitable for driving a transistor with a low voltage in order to achieve lower power consumption can be obtained.

5 Claims, 13 Drawing Sheets

DURING NORMAL OPERATION

DURING BURN-IN

DURING NORMAL OPERATION

DURING BURN-IN

SEMICONDUCTOR MEMORY DEVICE DRIVEN WITH LOW VOLTAGE

BACKGROUND OF THE INVENTION

1. Field of the Invention

The present invention relates to a semiconductor memory device, and more particularly to a semiconductor memory device including an array configuration suitable for attaining lower power consumption.

2. Description of the Background Art

In order to enhance operation characteristics and layout efficiency of a semiconductor memory device so as to adapt to drive with a lower voltage for attaining lower power consumption, an array configuration in which a configuration of an internal power supply system or a circuit configuration of a peripheral circuit is devised is disclosed, for example, in Japanese Patent Laying-Open Nos. 8-55480, 2000-21170, and 9-198867.

In recent years particularly, a semiconductor memory device attaining a smaller size and lower power consumption is further strongly demanded, considering mount on a portable instrument or the like premised on drive by a battery. Accordingly, a transistor (represented by an MOS (Metal Oxide Semiconductor) transistor) disposed on the semiconductor memory device has come to achieve a smaller size and a lower threshold voltage. Under such circumstances, aiming to achieve a stabilized operation under low voltage drive as well as optimal design of a power supply system, further improvement in the array configuration has been demanded.

SUMMARY OF THE INVENTION

The present invention was made to solve the above-described problems, and an object of the present invention is to provide a semiconductor memory device including an array configuration suitable for attaining lower power consumption.

A semiconductor memory device according to the present invention includes: a memory cell array having a plurality of memory cells arranged in rows and columns, a plurality of word lines arranged corresponding to the rows, and a plurality of bit line pairs arranged corresponding to the columns; a plurality of column selection lines provided corresponding to the columns; an address buffer receiving an address signal indicating selection from the rows and columns; a row decoder controlling a voltage of the plurality of word lines in accordance with the address signal received by the address buffer; a column decoder controlling a voltage of the plurality of column selection lines in accordance with the address signal received by the address buffer; a plurality of sense amplifiers provided corresponding to the plurality of bit line pairs and each amplifying a voltage difference on corresponding bit line pair; a data line pair provided in common to the plurality of bit lines; a plurality of column selection gates provided corresponding to the columns and each connecting corresponding bit line pair to the data line pair in accordance with a voltage of corresponding column selection line; a first power supply system supplying an operating power supply voltage for the column decoder; a second power supply system supplying an operating power supply voltage for the memory cell array and the plurality of sense amplifiers; and a third power supply system supplying an operating power supply voltage for a peripheral circuit including the address buffer.

A semiconductor memory device according to another configuration of the present invention includes: a memory cell array having a plurality of memory cells arranged in rows and columns, a plurality of word lines arranged corresponding to the rows, and a plurality of bit line pairs arranged corresponding to the columns; a plurality of sense amplifiers provided corresponding to the plurality of bit line pairs and each amplifying a voltage difference on corresponding bit line pair; a peripheral circuit for controlling an operation in the memory cell array; a sense power supply control circuit generating a sense control signal; and a sense power supply circuit controlling supply of an operating power supply voltage for the plurality of sense amplifiers in response to the sense control signal. The memory cell array and the plurality of sense amplifiers receive a first voltage as an operating power supply voltage, while the peripheral circuit receives a second voltage as an operating power supply voltage. The sense power supply control circuit includes a signal generation circuit operating upon receiving the second voltage, so as to generate a signal indicating an operation period of the plurality of sense amplifiers, and a level conversion circuit converting the signal having the second voltage generated by the signal generation circuit as an amplitude to a signal having the first voltage as an amplitude, so as to generate the sense control signal.

A semiconductor memory device according to yet another configuration of the present invention includes: a plurality of memory cells arranged in rows and columns in first and second areas; a word line arranged corresponding to each of the rows; first and second bit line pairs arranged in the first and second areas respectively so as to correspond to each column; a sense amplifier circuit provided between the first and second areas so as to correspond to each column and shared by the first and second bit line pairs; and a sense amplifier control circuit generating signals controlling an operation of the sense amplifier circuit. The sense amplifier circuit includes: a sense amplifier unit amplifying a voltage difference between a sense node pair; a first bit line isolation switch connected between the first bit line pair and the sense node pair and turned on or off in response to a first control signal generated by the sense amplifier control circuit; a second bit line isolation switch connected between the second bit line pair and the sense node pair and turned on or off in response to a second control signal generated by the sense amplifier control circuit; a first precharge/equalization circuit connecting the first bit line pair to a prescribed voltage when the first bit line isolation switch is turned off in response to an inverted signal of the first control signal; a second precharge/equalization circuit connecting the second bit line pair to the prescribed voltage when the second bit line isolation switch is turned off in response to an inverted signal of the second control signal; a logic circuit detecting turning off of both of the first and second bit line isolation switches based on the first and second control signals; and a third precharge/equalization circuit connecting the sense node pair to the prescribed voltage in response to detection by the logic circuit.

Therefore, a primary advantage of the present invention resides in ability to set the operating power supply voltage for the column decoder, that is, a high-level voltage for the column selection line, independently of the operating power supply voltage for the memory cell array and the sense amplifier circuit (array-relevant circuit) as well as of the operating power supply voltage for the peripheral circuit other than the column decoder. Accordingly, in the semiconductor memory device driven with a low voltage for attaining lower power consumption, higher efficiency in burn-in test as well as improvement in a data hold characteristic and an operation with higher speed are all achieved. In particular, the operating power supply voltage for the column decoder during normal operation is set as an intermediate voltage between the operating power supply voltage for the peripheral circuit and the operating power supply voltage for the array-relevant circuit, so that improvement in the data hold characteristic and the operation with higher speed can be balanced.

In addition, according to the semiconductor memory device of the present invention, supply of the operating power supply voltage to the sense amplifier can be controlled by the sense control signal having the operating power supply voltage for the memory cell array and the sense amplifier circuit (array-relevant circuit) as an amplitude, instead of the operating power supply voltage for the peripheral circuit. Therefore, even when the operating power supply voltage for the array-relevant circuit is higher than the operating power supply voltage for the peripheral circuit, the supply of the operating power supply voltage to the sense amplifier can reliably be cut off. As a result, the burn-in test can efficiently be conducted in a semiconductor memory device having a configuration suitable for attaining lower power consumption and having different thicknesses of the gate insulating films of the transistors in the peripheral circuit and the array-relevant circuit.

Moreover, in a shared sense amplifier configuration, the precharge/equalization circuits are provided corresponding to the sense node pair and the first and second bit line pairs arranged on opposing sides, respectively. Therefore, if a defect such as short-circuit takes place, the short-circuited portion can be disconnected and a precharge/equalization operation can be performed, thereby reducing a stand-by current. In particular, as execution of the precharge/equalization operation can be instructed based on the control signal instructing connection/disconnection between the sense amplifier and the first and second bit line pairs, the number of control signals generated in the sense amplifier control circuit can be reduced and a circuit area can be made smaller.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
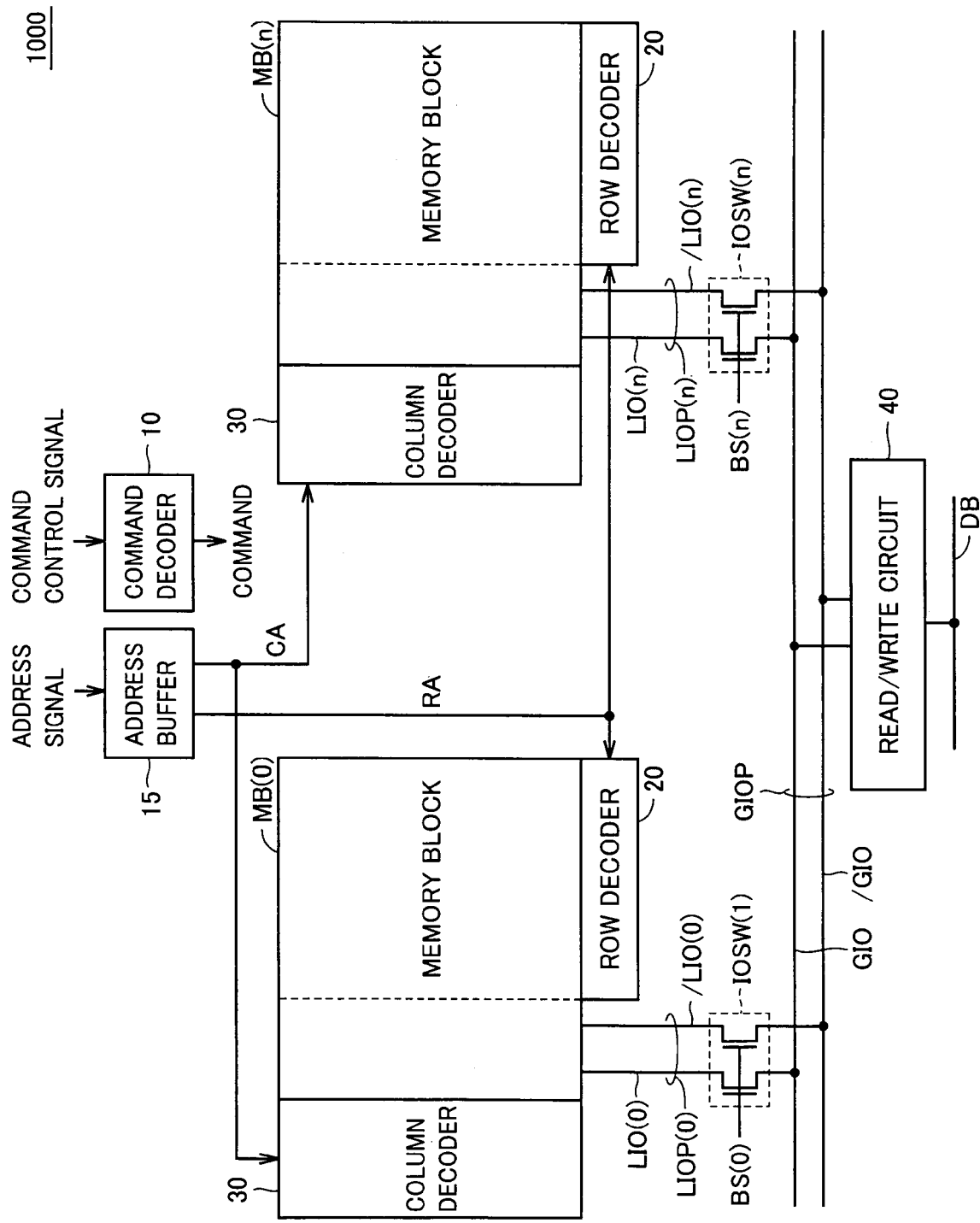
FIG. 1 is a schematic block diagram showing an overall configuration of a semiconductor memory device in embodiments of the present invention.

In the following, embodiments of the present invention will be described in detail with reference to the figures. It is noted that the same reference characters refer to the same or corresponding components in the figures.

First Embodiment

Referring to FIG. 1, a semiconductor memory device 1000 according to the embodiment of the present invention includes a command decoder 10, an address buffer 15, a plurality of memory blocks MB(0) to MB(n) (n represents a natural number), and a read/write circuit 40. Corresponding to each memory block MB (collective denotation of memory blocks MB(0) to MB(n) which will be used hereinafter), a row decoder 20 and a column decoder 30 are provided.

Command decoder 10 decodes an external command control signal, so as to generate a command instructing data writing, data reading, or the like. Address buffer 15 generates a row address RA, a column address CA or the like for designating a memory cell to be selected, in accordance with an external address signal. Selection of memory block MB is performed also based on a partial bit of the address signal.

Semiconductor memory device 1000 further includes local data line pairs LIOP(0) to LIOP(n) provided corresponding to memory blocks MB(0) to MB(n) respectively, and a global data line pair GIOP provided in common to memory blocks MB(0) to MB(n).

Each of local data line pairs LIOP (collective denotation of local data line pairs LIOP(0) to LIOP(n) which will be used hereinafter) is constituted of complementary local data lines LIO, /LIO. For example, local data line pair LIOP(0) is constituted of local data lines LIO(0) and /LIO(0), and local data line pair LIOP(n) is constituted of local data lines LIO(n) and /LIO(n). Similarly, global data line pair GIOP is constituted of complementary global data lines GIO and /GIO.

I/O switches IOSW(1) to IOSW(n) for connecting a local data line and a global data line that are in phase are provided between local data line pairs LIOP(0) to LIOP(n) and global data line pair GIOP, respectively. I/O switches IOSW(1) to IOSW(n) are turned on and off in response to block selection signals BS(0) to BS(n) indicating a result of selection from memory blocks MB(0) to MB(n) respectively.

Read/write circuit 40 drives global data lines GIO and /GIO so that a voltage difference in accordance with write data input via a data bus DB in data writing is produced. The voltage difference produced as a result of drive is transmitted to a selected memory cell in a selected memory array through I/O switch IOSW (collective denotation of I/O switches IOSW(1) to IOSW(n) which will be used hereinafter) and local data line pair LIOP.

Read/write circuit 40 amplifies the voltage difference transmitted to global data lines GIO and /GIO via local data line pair LIOP and I/O switch IOSW in accordance with storage data in the selected memory cell in the selected memory block during data reading, and outputs the read data to data bus DB. Data bus DB transmits the read data and write data to a not-shown input/output interface.

Figure 2:
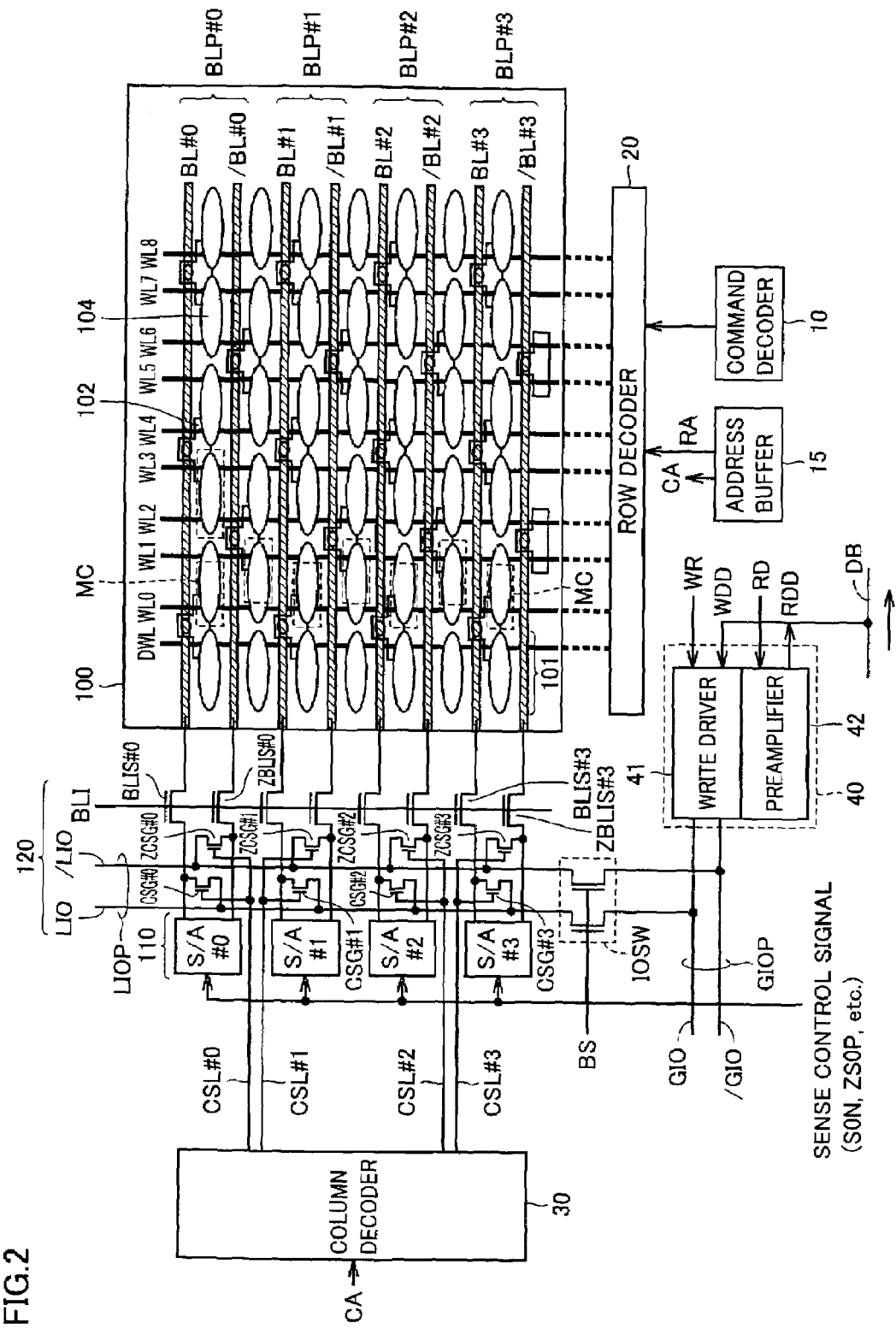
FIG. 2 illustrates in detail an array configuration of each memory block shown in FIG. 1.

FIG. 2 illustrates in detail an array configuration of each memory block shown in FIG. 1. Arrays in each memory block MB have a configuration similar to each other.

Referring to FIG. 2, memory block MB includes a memory cell array 100 in which a plurality of memory cells MC are arranged in rows and columns, a sense amplifier zone 110, and a data I/O zone 120.

In memory cell array 100, memory cells MC are arranged in rows and columns so as to include a dummy row 101. Word lines WL0 to WL8 are arranged corresponding to memory cell rows, and a dummy word line DWL is arranged corresponding to dummy row 101.

In addition, bit line pairs BLP#0 to BLP#3 are arranged corresponding to memory cell columns. Each of bit line pairs BLP#0 to BLP#3 has complementary bit lines BL and /BL. For example, bit line pair BLP#0 has complementary bit lines BL#0 and /BL#0. Here, the number of memory cell rows, memory cell columns and dummy rows is not limited to the example shown in FIG. 2, and may be set to any value.

Each memory cell MC is connected to either one of complementary bit lines BL and /BL every other line. For example, in the memory cell column corresponding to bit line pair BLP#0, the memory cells connected to word lines WL0, WL2, WL4, WL6, WL8 corresponding to even-number rows respectively are connected to bit line BL#0, and memory cells MC connected to word lines WL1, WL3, WL5, WL7 in odd-number rows respectively are connected to bit line/BL#0.

Each memory cell MC includes an access transistor formed using an active region 102, and a storage node 104. The access transistor is turned on in accordance with a voltage of corresponding word line WL, and electrically connects one of source/drain connected to storage node 104 to the other of source/drain connected to bit line BL or /BL.

Row decoder 20 controls a voltage of word lines WL0 to WL8 in accordance with row address RA generated by address buffer 15. Specifically, word line WL in a selected row is set to a selected state (logic high level; hereinafter, simply referred to as "H level"), and word line WL in a non-selected row is set to a non-selected state (logic low level; hereinafter, simply referred to as "L level").

In each memory cell MC in the selected row, storage node 104 is connected to corresponding bit line BL or /BL, in response to setting to an active state (H level) of corresponding word line WL.

Column decoder 30 controls a voltage of column selection lines CSL#0 to CSL#3 provided corresponding to the memory cell columns respectively, in accordance with column address CA generated by address buffer 15. Specifically, column selection line CSL (collective denotation of column selection lines CSL#0 to CSL#3 which will be used hereinafter) in a selected column is set to a selected state (H level), and column selection line CSL in a non-selected column is set to a non-selected state (L level).

Sense amplifier zone 110 includes sense amplifier circuits S/A#0 to S/A#3 provided corresponding to the memory cell columns respectively. Sense amplifier circuit S/A (collective denotation of sense amplifier circuits S/A#0 to S/A#3 which will be used hereinafter) is connected to corresponding bit lines BL, /BL through bit line isolation switches BLIS, ZBLIS arranged in data I/O zone 120 respectively. In other words, bit line isolation switches BLIS#0, ZBLIS#0 to BLIS#3, ZBLIS#3 are provided corresponding to bit lines BL#0, /BL#0 to BL#3, /BL#3 respectively. Sense amplifier circuit S/A receives a sense control signal described in detail later, which controls an operation of the sense amplifier circuit.

Bit line isolation switches BLIS, ZBLIS are constituted of n-channel MOS transistors, and receive a bit line isolation signal BLI at each gate. When bit line isolation signal BLI is at L level, each bit line BL, /BL is electrically disconnected from sense amplifier circuit S/A, and when bit line isolation signal BLI is at H level, each bit line BL, /BL is connected to corresponding sense amplifier circuit S/A.

Data I/O zone 120 further includes local data lines LIO, /LIO and column selection gates CSG#0, ZCSG#0 to CSG#3, ZCSG#3 provided corresponding to the memory cell columns respectively. In the following, column selection gates CSG#0 to CSG#3 are also collectively referred to as column selection gate CSG, and column selection gates ZCSG#0 to ZCSG#3 are also collectively referred to as column selection gate ZCSG.

Local data lines LIO, /LIO are arranged as higher-level data lines so as to implement a hierarchy with respect to bit lines BL#0, /BL#0 to BL#3, /BL#3.

In each memory cell column, column selection gates CSG and ZCSG constituted of n-channel MOS transistors are provided between corresponding bit lines BL, /BL and local data lines LIO, /LIO respectively. For example, column selection gates CSG#0 and ZCSG#0 are connected between bit lines BL#0, /BL#0 and local data lines LIO, /LIO respectively.

Each gate of column selection gates CSG, ZCSG is connected to corresponding column selection line CSL. For example, column selection line CSL#0 is connected to the gates of column selection gates CSG#0 and ZCSG#0. Accordingly, when column selection line CSL#0 is set to a selected state (H level), bit lines BL#0 and /BL#0 are connected to local data lines LIO and ALIO respectively, in response to turn-on of column selection gates CSG#0 and ZCSG#0. Here, as other column selection lines CSL#1 to CSL#3 are set to a non-selected state (L level), remaining bit lines BL#1, /BL#1 to BL#3, /BL#3 are not connected to local data lines LIO, /LIO.

I/O switch IOSW has transistor switches connected between local data lines LIO, /LIO and global data lines GIO, /GIO respectively. These transistor switches receive a common block selection signal BS (collective denotation of block selection signals BS(0) to BS(n) which will be used hereinafter) at the gates. Therefore, I/O switch IOSW is turned on when corresponding memory block MB is selected. Accordingly, among memory blocks MB(0) to MB(n) shown in FIG. 1, solely local data lines LIO, /LIO in the selected memory block are electrically connected to global data lines GIO, /GIO.

Read/write circuit 40 has a write driver 41 and a preamplifier 42. Write driver 41 operates in response to a control signal WR activated in a write operation, so as to produce a voltage difference in accordance with a control signal WDD indicating write data transmitted on data bus DB between global data lines GIO, /GIO. Preamplifier 42 operates in response to a control signal RD activated in data reading, and amplifies the voltage difference transmitted to global data lines GIO, /GIO so as to generate read data RDD, for output to data bus DB.

Figure 3:
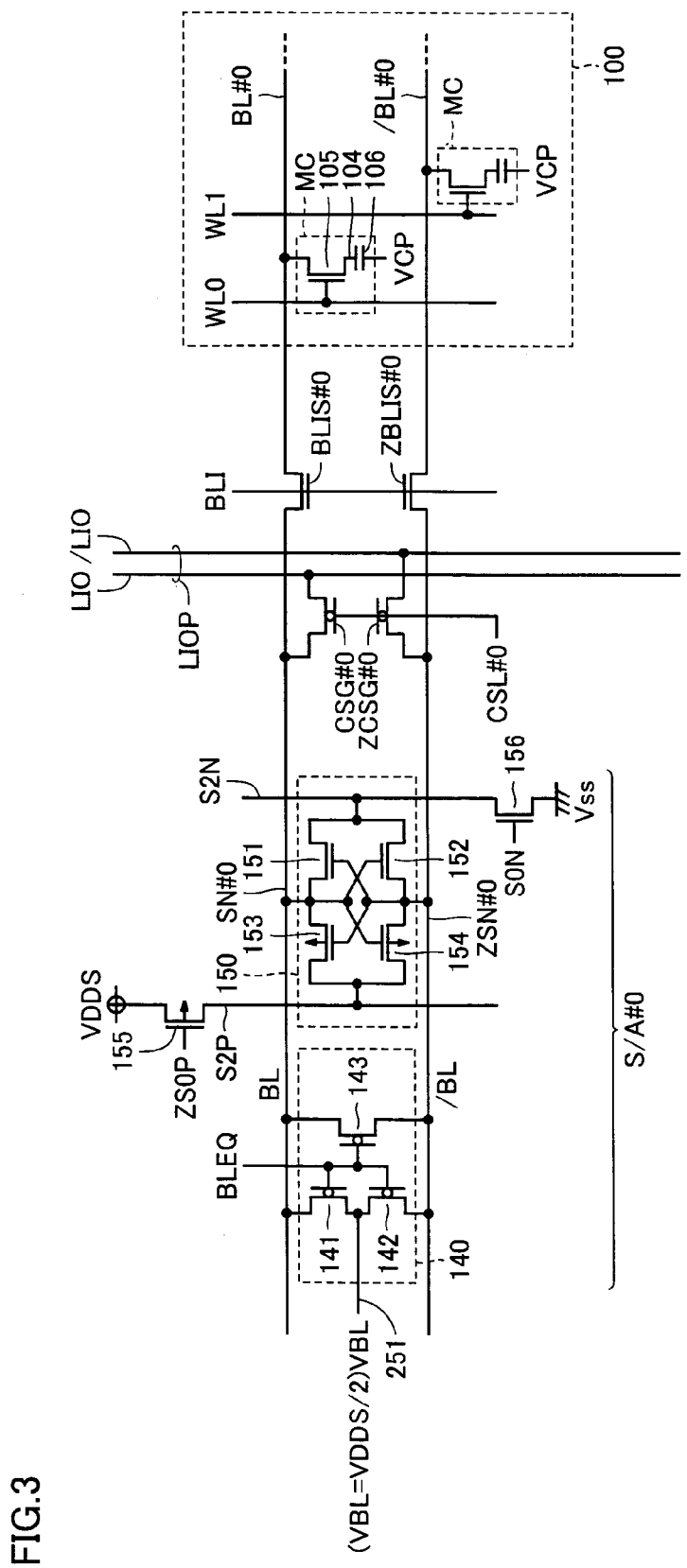
FIG. 3 is a circuit diagram illustrating in detail a sense amplifier circuit shown in FIG. 2.

FIG. 3 is a circuit diagram illustrating in detail the sense amplifier circuit shown in FIG. 2.

As each sense amplifier circuit S/A has a similar configuration, FIG. 3 shows a configuration of sense amplifier S/A#0 and a corresponding portion as an example.

Referring to FIG. 3, in memory cell array 100, memory cells MC are connected to bit line BL#0 in an even-number row represented by word line WL0, while memory cells MC are connected to bit line /BL#0 in an odd-number row represented by word line WL1. Memory cell MC includes an access transistor 105 which is an n-channel MOS transistor formed in active region 102 shown in FIG. 2, and a capacitor 106. Access transistor 105 is connected between bit line BL#0 (or /BL#0) and storage node 104, and has the gate connected to corresponding word line WL. Capacitor 106 is connected between storage node 104 and a node supplying a cell plate voltage VCP.

Bit lines BL#0 and /BL#0 are connected to sense nodes SN#0 and ZSN#0 constituting a sense node pair via bit line isolation switches BLIS#0 and ZBLIS#0.

Sense amplifier circuit S/A#0 has a precharge/equalization circuit 140 for precharging/equalizing sense nodes SN#0 and ZSN#0 to a bit line voltage VBL, and a sense amplifier unit 150 amplifying a voltage difference between sense nodes SN#0 and ZSN#0 (that is, between the sense node pair).

In general, bit line voltage VBL is set to ½ of an array power supply voltage VDDS comparable to a voltage amplitude of a bit line, that is, VBL=VDDS/2.

Precharge/equalization circuit 140 has n-channel MOS transistors 141 to 143. Sense amplifier unit 150 has n-channel MOS transistors 151, 152 and p-channel MOS transistors 153, 154.

In a semiconductor device, normally, two types of transistors, that is, an MOS transistor supplied with an external power supply voltage and an MOS transistor supplied with an internal voltage obtained by down-converting the external power supply voltage (hereinafter, referred to as "internal down-converted voltage") are employed. Out of these two types of MOS transistors, the MOS transistor supplied with the internal down-converted voltage has a gate insulating film thickness smaller than that of the MOS transistor supplied with the external power supply voltage. In the present specification, the MOS transistor having the former gate insulating film is hereinafter referred to as a "small thickness transistor," while the MOS transistor having the latter gate insulating film is referred to as a "large thickness transistor." It is noted that a voltage applied to the MOS transistor is not limited to the external power supply voltage and the internal down-converted voltage described above, and the large thickness transistor can be applied with a power supply voltage higher than that for the small thickness transistor. For example, as indication of a specific numeric value, the large thickness transistor has a gate insulating film thickness of approximately 6 to 8 nm with respect to a power supply voltage of approximately 5V at the maximum, whereas the small thickness transistor has a gate insulating film thickness of approximately 3 to 5 nm with respect to a power supply voltage of approximately 3V at the maximum.

For example, access transistor 105 arranged in the memory cell array is constituted of the large thickness transistors, because a boost voltage is applied to its gate when corresponding word line WL is selected. In general, if other manufacturing conditions such as impurity concentration are the same, the threshold voltage of the small thickness transistor is lower than that of the large thickness transistor. Though lower threshold voltage is advantageous for an operation in higher speed, the threshold current at turn-off is increased. Therefore, if access transistor 105 is constituted of large thickness transistors, it is advantageous in terms of the data hold characteristic when the word line is not selected.

As shown in FIG. 3, in the present specification, the n-channel MOS transistor and the p-channel MOS transistor are distinguished from each other by presence/absence of an arrow sign provided directly under the gate of the transistor. Meanwhile, the large thickness transistor and the small thickness transistor are distinguished from each other by presence/absence of a circle sign provided at a gate portion (the small thickness transistor is shown with a circle).

MOS transistors 151 to 154 constituting sense amplifier unit 150 are constituted of large thickness transistors, in a manner similar to access transistor 105 arranged in memory cell array 100. Bit line isolation switches BLIS, ZBLIS are also constituted of large thickness transistors.

On the other hand, MOS transistors 141 to 143 constituting precharge/equalization circuit 140 are constituted of small thickness transistors. Though not shown, the MOS transistors constituting the peripheral circuits for controlling the operation in memory cell array 100 such as command decoder 10, address buffer 15, row decoder 20, column decoder 30, or the like shown in FIG. 2 are also constituted of small thickness transistors. In addition, column selection gates CSG#0 and ZCSG#0 described in connection with FIG. 2 are also constituted of small thickness transistors.

In precharge/equalization circuit 140, n-channel MOS transistor 141 is electrically connected between a supply line 251 of bit line voltage VBL (hereinafter, also referred to as a VBL line 251) and sense node SN#0, and n-channel MOS transistor 142 is electrically connected between VBL line 251 and sense node ZSN#0. N-channel MOS transistor 143 is electrically connected between sense nodes SN#0 and ZSN#0.

Each gate of n-channel MOS transistors 141 to 143 commonly receives an equalization signal BLEQ. When equalization signal BLEQ is set to H level, n-channel MOS transistors 141 to 143 turn on, so as to precharge/equalize sense nodes SN#0 and ZSN#0 to bit line voltage VBL.

In sense amplifier unit 150, n-channel MOS transistors 151 and 152 are connected to each other such that a cross-coupled type amplifier is implemented between a sense power supply node S2N and sense nodes SN#0, ZSN#0. Similarly, p-channel MOS transistors 153 and 154 are connected to each other such that a cross-coupled type amplifier is implemented between a sense power supply node S2P and sense nodes SN#0, ZSN#0.

P-channel MOS transistor 155 is electrically connected between a supply node of internal power supply voltage VDDS used as an array power supply voltage and sense power supply node S2P. N-channel MOS transistor 156 is electrically connected between a ground node supplying a ground voltage Vss and sense power supply node S2N. MOS transistors 155 and 156 are also constituted of large thickness transistors.

If the configuration is such that burn-in test can be conducted while sense amplifier circuit S/A is isolated by bit line isolation switches BLIS and ZBLIS, MOS transistors 151 to 156 associated with sense amplifier unit 150 can be constituted of small thickness transistors.

The gate of n-channel MOS transistor 155 receives a sense control signal ZS0P, and the gate of p-channel MOS transistor 156 receives a sense control signal S0N. Array power supply voltage VDDS and ground voltage Vss are comparable to voltages of H level data and L level data respectively held by memory cell MC.

Figure 4:
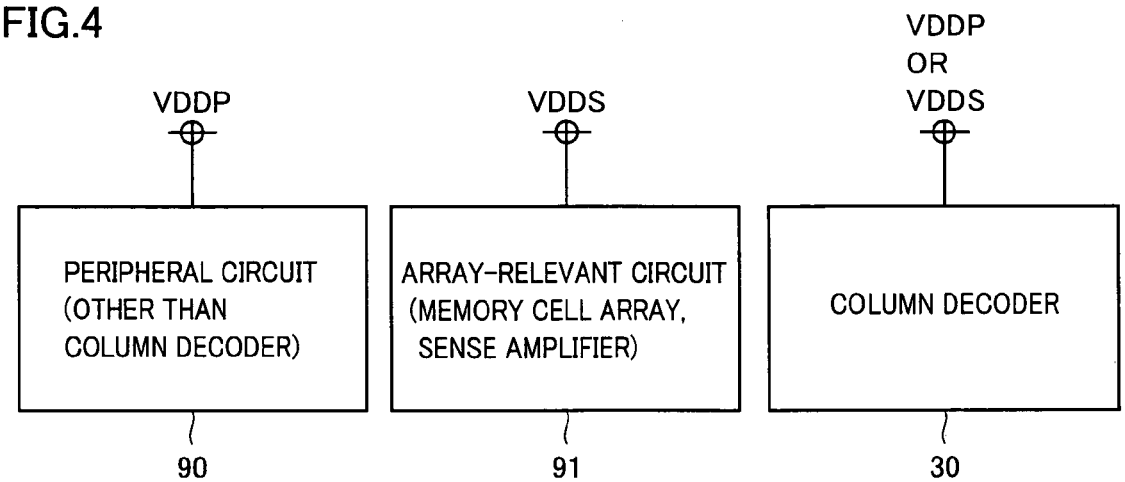
FIG. 4 is a schematic block diagram showing a configuration of a general power supply system shown as a comparative example.

FIG. 4 is a schematic block diagram showing a configuration of a general power supply system in a semiconductor memory device, shown as a comparative example.

In the configuration shown in FIG. 4, an internal power supply voltage VDDP serving as the operating power supply voltage for peripheral circuit 90 other than the column decoder (hereinafter, also referred to as "peripheral power supply voltage VDDP") is set to a level different from a level of array power supply voltage VDDS serving as the operating power supply voltage for array-relevant circuit 91 including memory cell array 100, sense amplifier circuit S/A and the like. Here, in general, VDDP is set to be higher than VDDS (VDDP>VDDS).

Peripheral circuit 90 shown in FIG. 4 includes circuits except for column decoder 30 among the peripheral circuits for controlling the operation in memory cell array 100, i.e., the circuits constituted of small thickness transistors such as command decoder 10, address buffer 15, row decoder 20, and the like shown in FIG. 2. On the other hand, array-relevant circuit 91 includes circuits constituted of large thickness transistors. The difference in the operating power supply voltages described above corresponds to the difference in the thicknesses of the gate insulating films of the MOS transistors.

Conventionally, one of array power supply voltage VDDS and peripheral power supply voltage VDDP has commonly been employed as the operating power supply voltage for column decoder 30. This is because, if a voltage generation circuit for generating an internal power supply voltage is used in common, reduction in a layout area and facilitated design are achieved.

On the other hand, it is sometimes advantageous and sometimes disadvantageous to employ either peripheral power supply voltage VDDP or array power supply voltage VDDS as the operating power supply voltage for column decoder 30, i.e., the voltage when column selection line CSL is selected (H level voltage). First, considering the data write characteristic, higher H level voltage of column selection line CSL, that is, adoption of peripheral power supply voltage VDDP, enables higher operation speed, because a frequency characteristic is improved.

Meanwhile, in an asynchronous DRAM (dynamic random access memory), lower H level voltage of the column selection line, that is, adoption of array power supply voltage VDDS, tends to improve the data hold characteristic.

Figure 5:
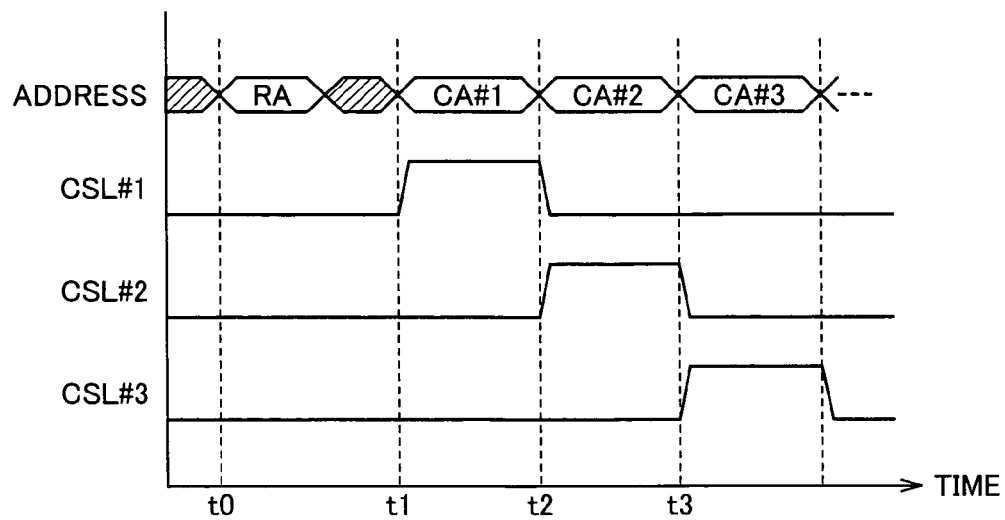
FIG. 5 is an operational waveform diagram illustrating a timing of selection of a column selection line in an asynchronous DRAM.

FIG. 5 is an operational waveform diagram illustrating a timing of selection of a column selection line in an asynchronous DRAM.

As shown in FIG. 5, in a page mode operation of the asynchronous DRAM, after row address RA is given at time t0, column address is successively updated to CA#1, CA#2 and CA#3 at time t1, t2 and t3 by a column address counter or the like. Accordingly, at time t1, column selection line CSL#1 rises from a non-selected state (L level) to a selected state (H level).

At time t2, column selection line CSL#1 falls from H level to L level, while column selection line CSL#2 rises from L level to H level.

Figure 6:
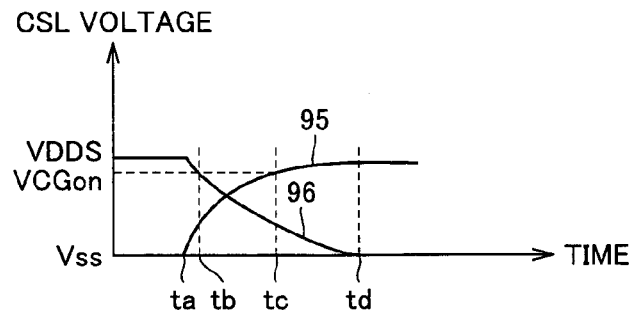
FIG. 6 is a first diagram showing transition of the voltage of a column selection line at a timing of switching of a column address in the asynchronous DRAM shown in FIG. 5.
Figure 7:
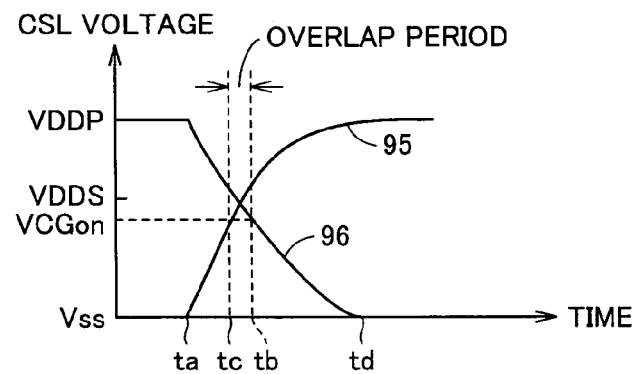
FIG. 7 is a second diagram showing transition of a voltage of the column selection line at a timing of switching of the column address in the asynchronous DRAM shown in FIG. 5.

FIGS. 6 and 7 show transition of a voltage of a column selection line at a timing of switching of a column address in the asynchronous DRAM shown in FIG. 5.

FIG. 6 shows a waveform when the H level voltage of the column selection line is set to array power supply voltage VDDS (low voltage), while FIG. 7 shows a waveform when the H level voltage of the column selection line is set to peripheral power supply voltage VDDP (high voltage).

In FIG. 6, when a column address is switched at time ta, a voltage of a newly selected column selection line 95 gradually rises and approaches array power supply voltage VDDS. On the other hand, a voltage of a column selection line 96 that has been selected till then starts to fall from array power supply voltage VDDS toward ground voltage Vss.

Here, a turn-on voltage VCGon of column selection gates CSG, ZCSG shown in FIGS. 2 and 3 is lower than array power supply voltage VDDS. As such, in FIG. 6, the column selection gate corresponding to column selection line 96 that has previously been selected is turned off at time tb. On the other hand, the column selection gate corresponding to newly selected column selection line 95 is turned on at time tc, and the voltage of column selection line 95 attains array power supply voltage VDDS at time td.

In this manner, when the H level voltage of the column selection line (array power supply voltage VDDS) is relatively close to turn-on voltage VCGon of the column selection gate, simultaneous turn-on of a plurality of column selection gates when the column address is switched can be prevented.

In contrast, as shown in FIG. 7, when the H level voltage of the column selection line (peripheral power supply voltage VDDP) is considerably higher than turn-on voltage VCGon of the column selection gate, turn-off time tb of the column selection gate corresponding to column selection line 96 that has previously been selected and turn-on time tc of the column selection gate of the newly selected column are reversed, resulting in generation of an overlap period during which a plurality of column selection gates are simultaneously turned on. This may cause erroneous data writing, resulting in poorer operation stability.

Alternatively, in the asynchronous DRAM, it is necessary to perform an equalization operation on a data line at a timing of switching of a column address (time t1, t2, t3 in FIG. 5). Therefore, if the H level voltage of the column selection line is high and the column selection gate is turned on too early, erroneous data writing may take place. For these reasons, particularly in the asynchronous DRAM, the data hold characteristic has been excellent when relatively low array power supply voltage VDDS is employed as the H level voltage of the column selection line.

Under such circumstances, with growing tendency toward an operation with a lower voltage, the configuration of the power supply system shown in FIG. 4 sometimes cannot achieve an efficient operation of column decoder 30.

For example, when the operating power supply voltage for column decoder 30 is used commonly for array-relevant circuit 91, a problem tends to be caused during the burn-in test. As a defect is sufficiently accelerated so as to improve efficiency during the burn-in test, a voltage as high as possible should be applied so long as the gate insulating film in the MOS transistor is not broken down.

Whereas the MOS transistor in array-relevant circuit 91 is constituted of large thickness transistors, column decoder 30 of which high-speed operation is desired is constituted of small thickness transistors. As such, the level of the high voltage suitable for the burn-in test is different between array-relevant circuit 91 and column decoder 30. If a common internal power supply voltage is supplied to both array-relevant circuit 91 and column decoder 30 as the operating power supply voltage, effective burn-in test may be impaired.

In addition, since a difference between array power supply voltage VDDS and the threshold voltage of the MOS transistor becomes smaller with the operation with a lower voltage being dominant, an operation margin in the sense amplifier is decreased.

From the foregoing reasons, considering trade-off between the data hold characteristic in the sense amplifier and the high-speed operation, the H level voltage of the column selection line, i.e., the operating power supply voltage for column decoder 30, now needs to be set to an intermediate voltage between peripheral power supply voltage VDDP and array power supply voltage VDDS, independently of peripheral circuit 90 and array-relevant circuit 91.

Figure 8:
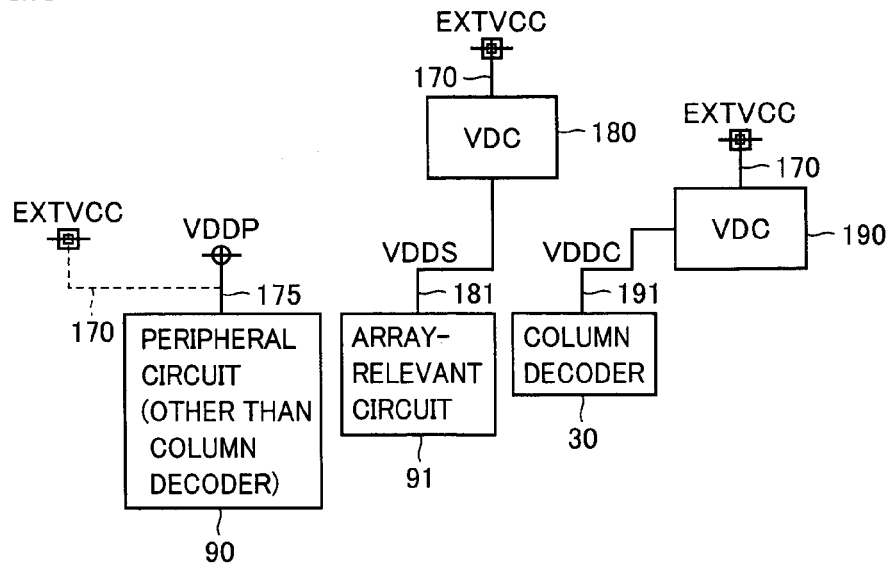
FIG. 8 is a schematic block diagram showing a configuration of a power supply system in a semiconductor memory device according to a first embodiment of the present invention.

FIG. 8 is a schematic block diagram showing a configuration of a power supply system in a semiconductor memory device according to a first embodiment of the present invention, in order to meet such a demand.

Referring to FIG. 8, in the semiconductor memory device according to the first embodiment, independent power supply systems are provided for peripheral circuit 90, array-relevant circuit 91 and column decoder 30, respectively. In other words, peripheral power supply voltage VDDP, array power supply voltage VDDS and column decoder power supply voltage VDDC generated independently of each other are supplied to peripheral circuit 90, array-relevant circuit 91 and column decoder 30 as the operating power supply voltage respectively. Peripheral circuit 90 includes address buffer 15 shown in FIG. 1. Array-relevant circuit 91 includes a word line driver (not shown) to which a boost voltage for selecting a word line in row decoder 20 in FIG. 1, access transistor 105 constituting a memory cell, and the like.

In the power supply system for array-relevant circuit 91, an internal voltage generation circuit 180 down-converting external power supply voltage EXTVCC supplied to an external power supply line 170 so as to generate array power supply voltage VDDS to an internal power supply line 181 is arranged. In the power supply system for column decoder 30, an independent internal voltage generation circuit 190 generating a column decoder power supply voltage VDDC to an internal power supply line 191 is arranged. Here, a configuration of a conventional voltage down converter (VDC) is applicable to internal voltage generation circuits 180, 190.

Similarly, the power supply system for peripheral power supply voltage VDDP may be configured with an internal voltage generation circuit (voltage down converter), or alternatively, it may be configured such that an internal power supply line 175 supplying peripheral power supply voltage VDDP is connected to external power supply line 170. In such a case, external power supply voltage EXTVCC is directly used as peripheral power supply voltage VDDP.

According to a configuration described above, the operating power supply voltage for column decoder 30, i.e., the H level voltage of the column selection line, can be set independently of array power supply voltage VDDS and peripheral power supply voltage VDDP. Therefore, more efficient burn-in test as well as improvement in the data hold characteristic and the operation in higher speed can be achieved. In the semiconductor memory device driven with a low voltage for lower power consumption, more efficient burn-in test as well as improvement in the data hold characteristic and the operation in higher speed can thus be achieved.

In particular, column decoder power supply voltage VDDC during normal operation is set as an intermediate voltage between peripheral power supply voltage VDDP and array power supply voltage VDDS, so that the data hold characteristic and the operation in higher speed can be achieved in a well-balanced manner.

Second Embodiment

A second embodiment describes a configuration of a column selection line driver suitable for lower power consumption.

As described previously, with the growing tendency toward low-voltage drive of the semiconductor memory device in recent years, a smaller thickness of the gate insulating film and a lower threshold voltage of the MOS transistor have been promoted. Correspondingly, a threshold leakage current per unit area tends to increase.

In particular, suppression of current consumption during stand-by (stand-by current) is demanded in the semiconductor memory device mounted on a portable instrument or the like. Therefore, reduction in the stand-by current in the column selection line driver driving a column selection line to a selected state or a non-selected state is demanded also in the semiconductor memory device according to the first embodiment, that is, in the configuration in which the operating power supply voltage for the column decoder is independent.

Figure 9:
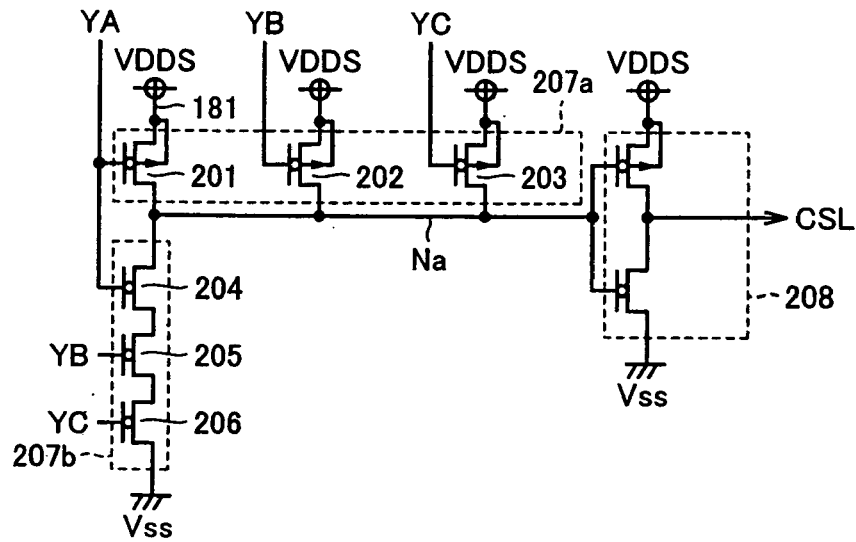
FIG. 9 is a circuit diagram showing a configuration of a general column selection line driver shown as a comparative example.

FIG. 9 is a circuit diagram showing a configuration of a general column selection line driver shown as a comparative example.

Referring to FIG. 9, a column selection line driver 200 shown as a comparative example includes p-channel MOS transistors 201 to 203 constituting a connection control portion 207a, n-channel MOS transistors 204 to 206 constituting a connection control portion 207b, and an inverter 208. Column selection line driver 200 is constituted of small thickness transistors.

P-channel MOS transistors 201 to 203 are connected in parallel between internal power supply line 181 supplying array power supply voltage VDDS and an internal node Na. N-channel MOS transistors 204 to 206 are connected in series between internal node Na and a ground node (ground voltage Vss). Inverter 208 operates as a "drive portion" setting column selection line CSL to one of array power supply voltage VDDS corresponding to the selected state (H level) and ground voltage Vss corresponding to the non-selected state (L level), in accordance with a voltage of internal node Na.

Each gate of p-channel MOS transistor 201 and n-channel MOS transistor 204 receives a column decode signal YA, the gates of p-channel MOS transistor 202 and n-channel MOS transistor 205 commonly receive a column decode signal YB, and each gate of p-channel MOS transistor 203 and n-channel MOS transistor 206 commonly receives a column decode signal YC.

In other words, MOS transistors 201 and 204 are turned on and off in a manner complementary to each other in response to column decode signal YA, MOS transistors 202 and 205 are turned on and off in a manner complementary to each other in response to column decode signal YB, and MOS transistors 203 and 206 are turned on and off in a manner complementary to each other in response to column decode signal YC.

In column selection line driver 200, when all column decode signals YA to YC are set to H level, all p-channel MOS transistors 201 to 203 connected in parallel are turned off and all n-channel MOS transistors 204 to 206 connected in series are turned on. Accordingly, internal node Na is connected to ground voltage Vss, and inverter 208 drives column selection line CSL to the selected state (H level).

On the other hand, when at least one of column decode signals YA to YC is set to L level, at least one of transistors 201 to 203 connected in parallel connects internal node Na to array power supply voltage VDDS. Meanwhile, as at least one of transistors 204 to 206 connected in series is turned off, internal node Na is disconnected from ground voltage Vss. Therefore, internal node Na is set to array power supply voltage VDDS (H level), and inverter 208 drives column selection line CSL to the non-selected state (L level).

In the configuration of column selection line driver 200 shown in FIG. 9, however, if any of column decode signals YA to YC is set to L level, internal node Na is connected to array power supply voltage VDDS even during stand-by. Accordingly, the stand-by current is consumed by an off-leakage current (sub threshold current) of n-channel MOS transistors 204 to 206. The current consumption here increases as the threshold voltage of the MOS transistor is lowered correspondingly to low-voltage drive of the semiconductor memory device.

Figure 10:
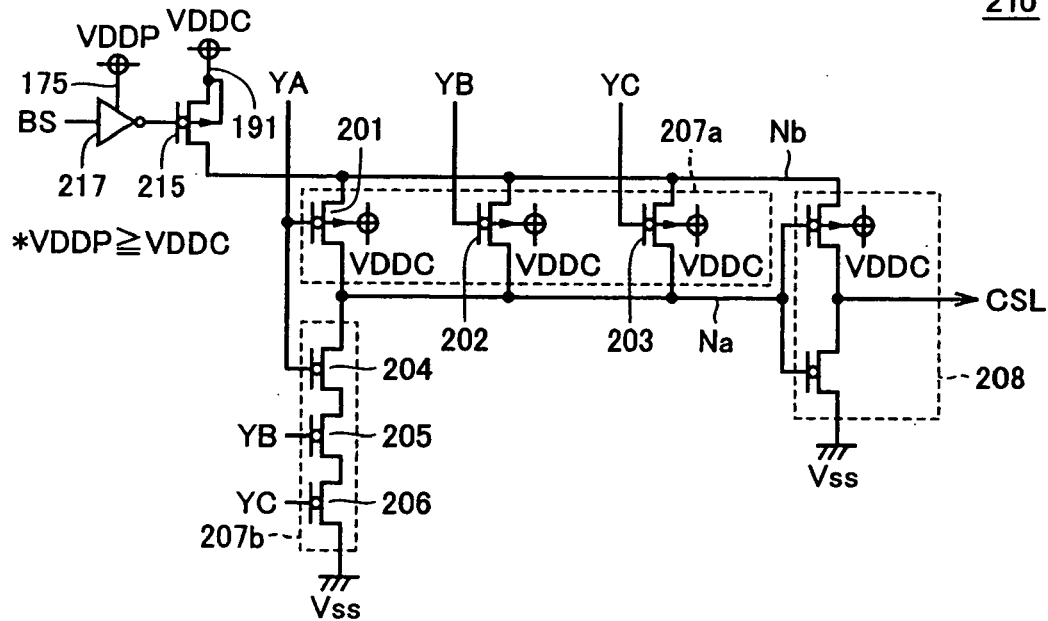
FIG. 10 is a circuit diagram showing a configuration of a column selection line driver according to a second embodiment.

FIG. 10 is a circuit diagram showing a configuration of a column selection line driver according to the second embodiment, for overcoming the above-described problems. A column selection line driver 210 shown in FIG. 10 is arranged in column decoder 30 in a manner corresponding to each column selection line CSL in the semiconductor memory device according to the first embodiment. Column selection line driver 210 is also constituted of small thickness transistors.

Referring to FIG. 10, column selection line driver 210 according to the second embodiment includes p-channel MOS transistors 201 to 203, n-channel MOS transistors 204 to 206 and inverter 208 arranged in a manner similar to FIG. 9 as well as a p-channel MOS transistor 215 operating as a "switching element".

In column selection line driver 210, p-channel transistors 201 to 203 provided as "connection control portion 207a" for connecting column decoder power supply voltage VDDC and internal node Na in accordance with a result of column selection are connected in parallel between internal node Nb and internal node Na. That is, the sources of p-channel MOS transistors 201 to 203 are supplied with column decoder power supply voltage VDDC via p-channel MOS transistor 215, instead of receiving direct supply of the same.

As described previously, n-channel MOS transistors 204 to 206 operate as "connection control portion 207b" operating in a manner complementary to connection control portion 207a in accordance with a result of column selection and connecting ground voltage Vss and internal node Na.

P-channel MOS transistor 215 is electrically connected between internal power supply line 191 (column decoder power supply voltage VDDC) and internal node Nb, and receives block selection signal BS inverted by an inverter 217 at its gate. As described in connection with FIG. 1, block selection signal BS is set to H level when corresponding memory block MB is selected, and it is set to L level when corresponding memory block MB is not selected.

Inverter 217 is driven by peripheral power supply voltage VDDP. Therefore, when corresponding memory block MB is selected, the gate of transistor 215 receives L level (ground voltage Vss), and internal node Nb is connected to column decoder power supply voltage VDDC. Here, column selection line driver 210 operates in a manner similar to column selection line driver 210 shown in FIG. 9.

In contrast, when corresponding memory block MB is not selected, the gate of transistor 215 receives H level (peripheral power supply voltage VDDP). As VDDP is equal to or larger than VDDC (VDDP≧VDDC), transistor 215 is turned off and internal node Nb is disconnected from column decoder power supply voltage VDDC.

Therefore, during stand-by in which column decoder 30 does not have to operate such as when corresponding memory block MB is not selected, internal node Na is not connected to column decoder power supply voltage VDDC. Accordingly, the off-leakage current is not caused by n-channel MOS transistors 204 to 206. In this manner, reduction in the stand-by current in column selection line driver 210 is achieved, which in turn contributes to lower power consumption in the semiconductor memory device.

The first and second embodiments have shown the configuration in which p-channel transistor 215 provided as the "switching element" is turned on/off in response to block selection signal BS because column decoder 30 is provided corresponding to each memory block. Alternatively, block selection signal BS may be replaced with a signal having information corresponding to operation/stand-by of the column decoder as necessary, in accordance with a manner of arrangement of column decoder 30.

Third Embodiment

In a third embodiment, a configuration of a power supply system capable of effective burn-in test in the semiconductor memory device according to the first embodiment, that is, in the configuration in which the operating power supply voltage for the column decoder is independent, will be described.

The configuration described in the third embodiment is particularly effective in an example in which column decoder power supply voltage VDDC and array power supply voltage VDDS during normal operation are set to the same level, considering the data hold characteristic.

Figure 11:
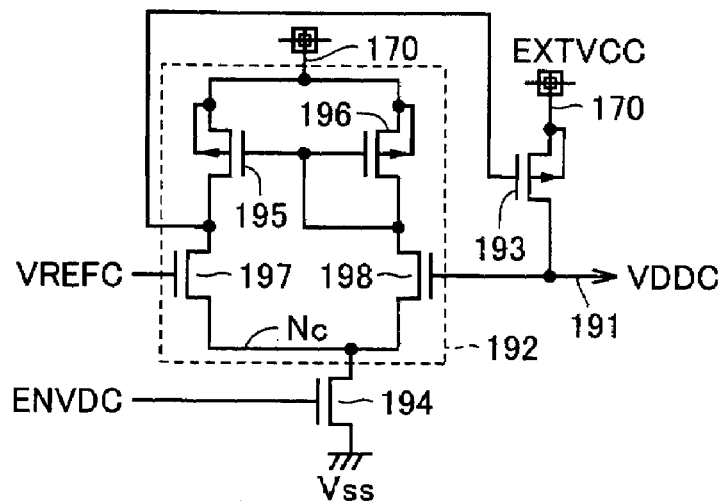
FIG. 11 is a circuit diagram showing a configuration of an internal voltage generation circuit generating a column decoder power supply voltage (VDDC) in a power supply system according to a third embodiment.

FIG. 11 is a circuit diagram showing a configuration of internal voltage generation circuit 190 generating column decoder power supply voltage VDDC. Internal voltage generation circuit 190 is constituted of large thickness transistors.

Referring to FIG. 11, internal voltage generation circuit 190 includes a current mirror amplifier 192, a current supply control transistor 193, and an operating current switch 194 to current mirror amplifier 192.

Current mirror amplifier 192 has p-channel MOS transistors 195, 196 and n-channel MOS transistors 197, 198. Transistors 195 and 197 are connected in series between external power supply line 170 supplying external power supply voltage EXTVCC and a node Nc. Transistors 196 and 198 are connected in series between external power supply line 170 and node Nc, in parallel to transistors 195 and 197.

Each gate of p-channel MOS transistors 195 and 196 is connected to connection node of MOS transistors 196 and 198. The gate of MOS transistor 197 receives a reference voltage VREFC comparable to a target value of column decoder power supply voltage VDDC, and the gate of transistor 198 is connected to internal power supply line 191.

Operating current switch 194 is constituted of n-channel MOS transistors electrically connected between node Nc and the ground node (ground voltage Vss). The gate of MOS transistor 194 receives an enable signal ENVDC. Enable signal ENVDC is set to H level during operation of internal voltage generation circuit 190. While enable signal ENVDC is at H level, an operating current is supplied to current mirror amplifier 192 in response to turn-on of MOS transistor 194. In this manner, during operation of current mirror amplifier 192, a voltage obtained by amplifying a voltage difference between the voltage on internal power supply line 191 and reference voltage VREFC is produced at an output node of current mirror amplifier 192, that is, at the connection node of MOS transistors 195 and 197.

On the other hand, while enable signal ENVDC is at L level, MOS transistor 194 is turned off and current mirror amplifier 192 does not operate.

Current supply control transistor 193 is constituted of p-channel MOS transistors electrically connected between external power supply line 170 and internal power supply line 191. The gate of MOS transistor 193 is connected to the output node of current mirror amplifier 192.

According to such a configuration, when column decoder power supply voltage VDDC becomes lower than reference voltage VREFC while enable signal ENVDC is set to H level, current supply control transistor 193 is turned on, and a current is supplied from external power supply line 170 to internal power supply line 191. On the other hand, when column decoder power supply voltage VDDC is higher than reference voltage VREFC, current supply control transistor 193 is turned off, and current supply from external power supply line 170 to internal power supply line 191 is cut off.

According to the operation as above, column decoder power supply voltage VDDC on internal power supply line 191 is controlled to reference voltage VREFC.

Figure 12:
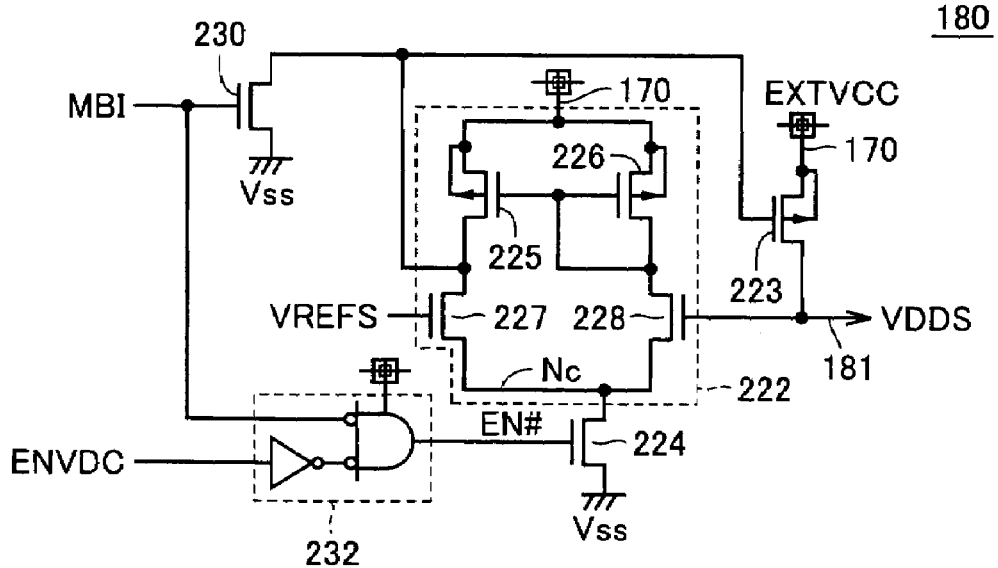
FIG. 12 is a circuit diagram showing a configuration of an internal voltage generation circuit generating an array power supply voltage (VDDS) in the power supply system according to the third embodiment.

FIG. 12 is a circuit diagram showing a configuration of internal voltage generation circuit 180 generating array power supply voltage VDDS.

Referring to FIG. 12, internal voltage generation circuit 180 further includes an n-channel MOS transistor 230 and a logic circuit 232, in addition to a current mirror amplifier 222, a current supply control transistor 223, and an operating current switch 224 to current mirror amplifier 222.

Current mirror amplifier 222 has p-channel MOS transistors 225, 226 and n-channel MOS transistors 227, 228. As arrangement and configuration of current mirror amplifier 222, current supply control transistor 223 and operating current switch 224 are the same as those of current mirror amplifier 192, current supply control transistor 193 and operating current switch 194 in internal voltage generation circuit 190 shown in FIG. 11, detailed description thereof will not be repeated.

N-channel MOS transistor 230 is electrically connected between the gate of current supply control transistor 223 and the ground node (ground voltage Vss), and receives a burn-in signal MBI at the gate. Burn-in signal MBI is generated, for example, by command decoder 10 shown in FIG. 1 in response to an input of a specific combination of command control signals. Burn-in signal MBI is set to H level during burn-in test, while it is set to L level during other period such as during normal operation.

Logic circuit 232 outputs a result of AND (logical multiplication) logical operation of an inverted signal of burn-in signal MBI and enable signal ENVDC as a control signal EN#. Control signal EN# is input to the gate of n-channel MOS transistor (operating current switch) 224. Consequently, control signal EN# is set to L level while enable signal ENVDC is at L level and during burn-in test, so as to cut off the operating current to current mirror amplifier 222.

Therefore, during burn-in test (MBI=H level), the operation of current mirror amplifier 222 is stopped and n-channel MOS transistor 230 is turned on, whereby the gate of current supply control transistor 230 is fixed to ground voltage Vss. Consequently, internal power supply line 181 is directly connected to external power supply line 170, and external power supply voltage EXTVCC directly serves as column decoder power supply voltage VDDC.

During a period except for burn-in test (MBI=L level), internal voltage generation circuit 180 operates in a manner similar to internal voltage generation circuit 190 shown in FIG. 11.

Figure 13A:
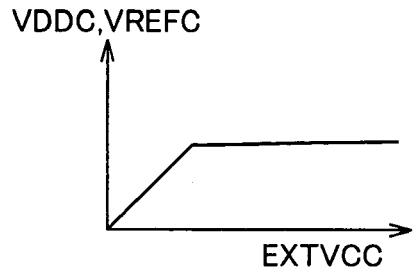
FIGS. 13A and 13B are conceptual diagrams illustrating a characteristic corresponding to an external power supply voltage, of the internal voltage generation circuit shown in FIG. 11.
Figure 13B:
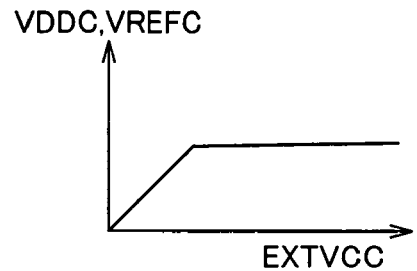

FIGS. 13A and 13B are conceptual diagrams illustrating a characteristic corresponding to external power supply voltage EXTVCC, of internal voltage generation circuit 190 shown in FIG. 11.

Referring to FIG. 13, the operation is not particularly switched in internal voltage generation circuit 190 during normal operation and during burn-in test. Therefore, as shown in FIGS. 13A and 13B respectively, during normal operation and during burn-in test, a variation characteristic of column decoder power supply voltage VDDC with respect to external power supply voltage EXTVCC is similar.

In general, reference voltage VREFC is generated so as to produce a voltage in accordance with external power supply voltage EXTVCC. Accordingly, reference voltage VREFC is raised with an increase in external power supply voltage EXTVCC until a certain level is attained. Reference voltage VREFC, however, is saturated in a high voltage region of external power supply voltage EXTVCC, and reference voltage VREFC is not raised to too high a level even if external power supply voltage EXTVCC is raised.

As a result, though column decoder power supply voltage VDDC in accordance with a prescribed reference voltage VREFC is generated during normal operation in internal voltage generation circuit 190, too high a voltage is not produced even during burn-in, as shown in FIG. 13B. Accordingly, such an excessively large voltage as to impair reliability of a transistor due to breakdown of the gate insulating film is not applied to the small thickness transistors constituting column decoder 30.

Figure 14A:
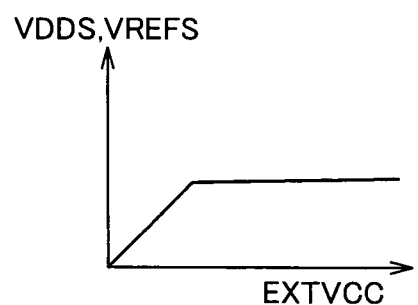
FIGS. 14A and 14B are conceptual diagrams illustrating a characteristic corresponding to an external power supply voltage, of the internal voltage generation circuit shown in FIG. 12.
Figure 14B:
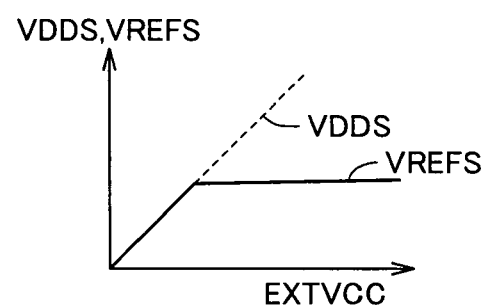

On the other hand, FIGS. 14A and 14B show a characteristic corresponding to external power supply voltage EXTVCC, of internal voltage generation circuit 180 shown in FIG. 12.

As the characteristic during normal operation shown in FIG. 14A is the same as that in FIG. 13A, detailed description thereof will not be repeated. In particular, reference voltages VREFC and VREFS are commonly used, whereby the number of reference voltage generation circuits is reduced and a setting attaining excellent data hold characteristic can be made.

On the other hand, as shown in FIG. 14B, during burn-in test in which external power supply voltage EXTVCC is set to a high voltage, array power supply voltage VDDS is not controlled based on reference voltage VREFC but is raised with the increase in external power supply voltage EXTVCC. Accordingly, though reference voltage VREFS is saturated during burn-in test, array power supply voltage VDDS can be set to a high voltage in accordance with the increase in external power supply voltage EXTVCC.

As described above, an efficient test can be conducted by applying a high voltage stress to the large thickness transistors constituting the array-relevant circuit. According to the configuration in the third embodiment as above, array power supply voltage VDDS and column decoder power supply voltage VDDC can be set to the same level during normal operation, and preferable burn-in test can be conducted on both the large thickness transistor and the small thickness transistor.

Fourth Embodiment

In a fourth embodiment, a configuration example in which the operating power supply voltage for circuits driving global data lines GIO, /GIO is used in common to the column decoder in the semiconductor memory device according to the first embodiment, that is, in the configuration in which the operating power supply voltage for the column decoder is independent, will be described.

Figure 15:
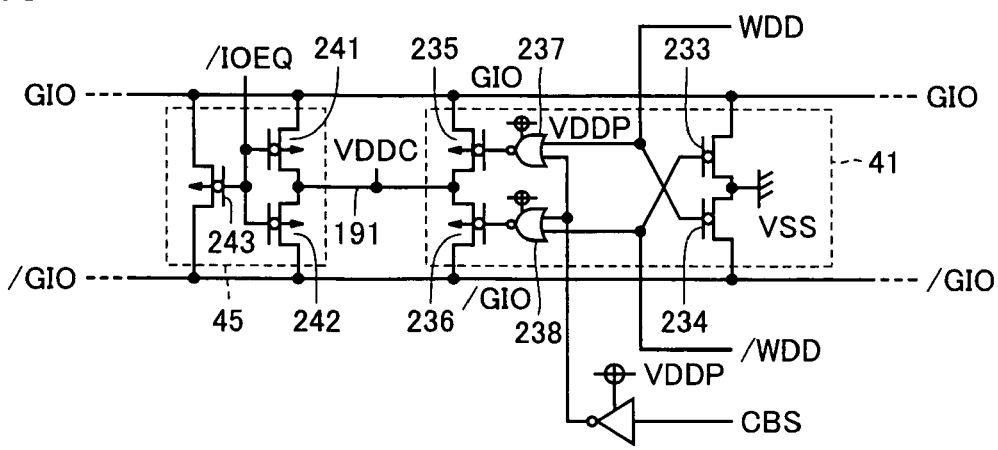
FIG. 15 is a circuit diagram showing a configuration of a write driver and a global data line precharge circuit according to a fourth embodiment.

FIG. 15 is a circuit diagram showing a configuration of write driver 41 and a global data line precharge circuit 45 according to the fourth embodiment.

Referring to FIG. 15, write driver 41 includes n-channel MOS transistors 233, 234, p-channel MOS transistors 235, 236, and logic gates 237, 238. Write driver 41 is constituted of small thickness transistors.

N-channel MOS transistors 233, 234 are electrically connected between global data lines GIO, /GIO and the ground node (ground voltage Vss) respectively. The gate of n-channel MOS transistor 234 receives a control signal WDD indicating write data, and the gate of n-channel MOS transistor 233 receives a control signal /WDD indicating inverted write data.

Logic gate 237 outputs a result of an NOR operation of control signal WDD and an inverted signal of a control signal CBS. Logic gate 238 outputs a result of an NOR operation of control signal /WDD and an inverted signal of control signal CBS. Control signal CBS is set to H level during data writing by write driver 41, and it is otherwise set to L level.

P-channel MOS transistors 235, 236 are electrically connected between global data lines GIO, /GIO and internal power supply line 191 (column decoder power supply voltage VDDC) respectively. The gate of p-channel MOS transistor 235 receives an output signal from logic gate 237, and the gate of p-channel MOS transistor 236 receives an output signal from logic gate 238.

While control signal CBS is at L level, that is, while write driver 41 is not operating, the output signals from logic gates 237 and 238 are both set to H level, and accordingly, p-channel MOS transistors 235, 236 are turned off. In addition, as each of control signals WDD and /WDD indicating write data is also fixed to L level, n-channel MOS transistors 233, 234 are also turned off. -Therefore, write driver 41 does not drive global data lines GIO, /GIO to any voltage.

In contrast, during operation of write driver 41, control signal CBS is set to H level, and control signals WDD and /WDD are set to either H level or L level respectively in a complementary manner, in accordance with the write data.

Accordingly, when the write data is at H level (WDD=H level and /WDD=L level), MOS transistors 234 and 235 are turned on, and MOS transistors 233 and 236 are turned off. Then, global data line GIO is driven to H level (column decoder power supply voltage VDDC), and global data line /GIO is driven to L level (ground voltage Vss). In contrast, when write data is at L level (WDD=L level and /WDD=H level), MOS transistors 233 and 236 are turned on, and MOS transistors 234 and 235 are turned off. Therefore, global data line GIO is driven to L level, while global data line /GIO is driven to H level.

Global data line precharge circuit 45 has p-channel MOS transistors 241 to 243 constituted of small thickness transistors. P-channel MOS transistor 243 is electrically connected between global data lines GIO and /GIO. P-channel MOS transistors 241 and 242 are electrically connected between global data lines GIO, /GIO and internal power supply line 191 respectively. Each gate of p-channel MOS transistors 241 to 243 receive a global data line equalization signal /IOEQ.

In this manner, while global data line equalization signal /IOEQ is at L level, global data line precharge circuit 45 precharges global data lines GIO and /GIO to column decoder power supply voltage VDDC in response to turn-on of p-channel MOS transistors 241 to 243.

In the conventional configuration, peripheral power supply voltage VDDP has generally been used in common to the peripheral circuits as the H level voltage and the precharge voltage for global data lines GIO and /GIO. As described in the first to third embodiments, however, in the semiconductor memory device using an independent operating power supply voltage for the column decoder, column decoder power supply voltage VDDC can be set to an intermediate voltage between peripheral power supply voltage VDDP and array power supply voltage VDDS.

When such a power supply system is employed, power consumption lower than in employing peripheral power supply voltage VDDP can be achieved by setting an amplitude of global data lines GIO and /GIO to column decoder power supply voltage VDDC, and data writing can be performed in higher speed than in employing array power supply voltage VDDS. That is, a setting such that lower power consumption and high operation speed are balanced can be made.

Though write driver 41 and global data line precharge circuit 45 have been shown as representatives in FIG. 15, column decoder power supply voltage VDDC may also be employed as the operating power supply voltage for other circuits driving the voltage of global data lines GIO and /GIO.

Fifth Embodiment

In a fifth embodiment, how to overcome a problem during burn-in test in the semiconductor memory device in which the peripheral circuit is constituted of small thickness transistors and the array-relevant circuit is constituted of large thickness transistors will be described. Unlike the first to fourth embodiments, the configuration shown in fifth and sixth embodiments is applicable also to an example in which the column decoder power supply voltage is not independent of array power supply voltage VDDS and peripheral power supply voltage VDDP.

As described previously, a voltage preferably applied in burn-in test is different between the peripheral circuit constituted of small thickness transistors and the array-relevant circuit constituted of large thickness transistors, from a viewpoint of reliability of the transistor and efficiency in the test. That is, as to peripheral power supply voltage VDDP and array power supply voltage VDDS, VDDP is set to be higher than VDDS (VDDP>VDDS) in normal operation, while VDDS is set to be higher than VDDP (VDDS>VDDP) during burn-in test. If such a relation of magnitude between peripheral power supply voltage VDDP and array power supply voltage VDDS is reversed between the normal operation and the burn-in test, a problem as stated below may take place in the sense amplifier circuit.

Figure 16:
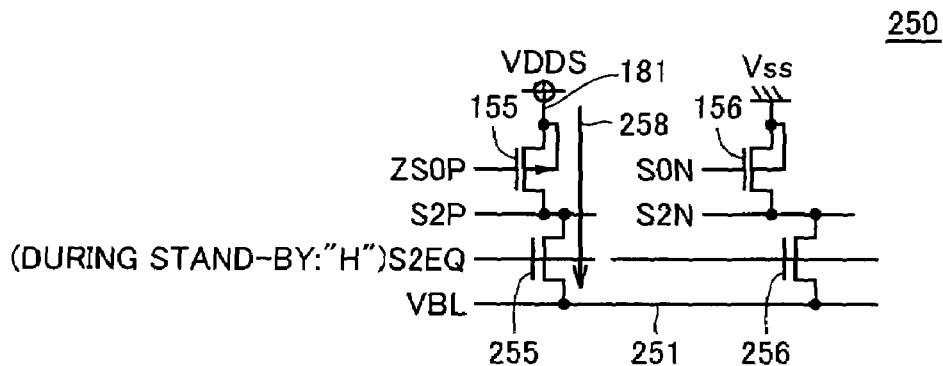
FIG. 16 is a circuit diagram illustrating a configuration for supplying power to a sense amplifier circuit.

FIG. 16 is a circuit diagram illustrating a configuration for supplying power to the sense amplifier circuit.

Referring to FIG. 16, a sense power supply circuit 250 for supplying power to the sense amplifier circuit further includes n-channel MOS transistors 255 and 256 for precharging sense power supply nodes S2P, S2N, in addition to p-channel MOS transistor 155 and n-channel MOS transistor 156 shown also in FIG. 3. N-channel MOS transistors 255 and 256 are constituted of large thickness transistors, similar to MOS transistors 155, 156.

N-channel MOS transistor 255 is electrically connected between VBL line 251 and sense power supply node S2P, and n-channel MOS transistor 256 is electrically connected between VBL line 251 and sense power supply node S2N. Each gate of n-channel MOS transistors 255 and 256 receives an equalization signal S2EQ.

During operation of the sense amplifier, sense control signal S0N is set to H level and sense control signal ZS0P is set to L level. As such, sense power supply nodes S2P, S2N receive supply of array power supply voltage VDDS and ground voltage Vss respectively.

In contrast, during stand-by of the sense amplifier circuit, sense control signal S0N is set to L level and sense control signal ZS0P is set to H level. In addition, equalization signal S2EQ is set to H level and sense power supply nodes S2P and S2N are precharged and equalized to bit line voltage VBL (VDDS/2). On the other hand, during operation of the sense amplifier circuit, equalization signal S2EQ is set to L level and sense power supply nodes S2P and S2N are disconnected from VBL line 251.

Figure 17:
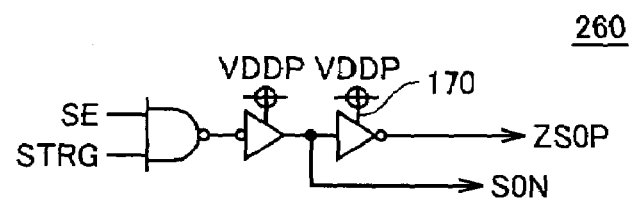
FIG. 17 is a circuit diagram illustrating a configuration of a general sense power supply control circuit shown as a comparative example.

FIG. 17 is a circuit diagram illustrating a general configuration of a sense power supply control circuit generating sense control signals S0N, ZS0P, shown as a comparative example.

Referring to FIG. 17, a general sense power supply control circuit 260 shown as a comparative example is constituted of a logic gate employing peripheral power supply voltage VDDP as the operating power supply voltage and an inverter, and generates sense control signals S0N, ZS0P in response to a sense enable signal SE and a sense start signal STRG.

Sense enable signal SE is set to an active state (H level) at a timing determined by the sense amplifier circuit which operates in response to determination of an address, before a timing of activation of a word line in a selected memory block. In contrast, sense start signal STRG is set to an active state (H level) in accordance with a timing when a word line in a selected row is set to the selected state (H level) and a voltage difference in accordance with read data is produced on bit line pair BLP after sense enable signal SE is set to the active state.

Sense power supply control circuit 260 sets sense control signals S0N and ZS0N to H level and L level respectively during a period in which both of sense enable signal SE and sense start signal STRG are set to H level, and supplies the operating power supply voltage (array power supply voltage VDDS) to the sense amplifier circuit.

In other words, in a general configuration, the H level voltage of sense control signals S0N and ZS0P is set to peripheral power supply voltage VDDP, and the L level voltage thereof is set to ground voltage Vss. In addition, during stand-by of the sense amplifier circuit, sense control signal S0N is set to L level and sense control signal ZS0P is set to H level.

If VDDS is set higher than VDDP (VDDS>VDDP) during burn-in test as described above, the voltages of the source and the gate of the p-channel MOS transistor are reversed therebetween. In particular, if a relation of VDDP<VDDS−Vthp (Vthp: an absolute value of the threshold voltage of the p-channel MOS transistor) is attained, p-channel MOS transistor 155 is not turned off and a through current 258 is produced, as shown in FIG. 16.

Figure 18:
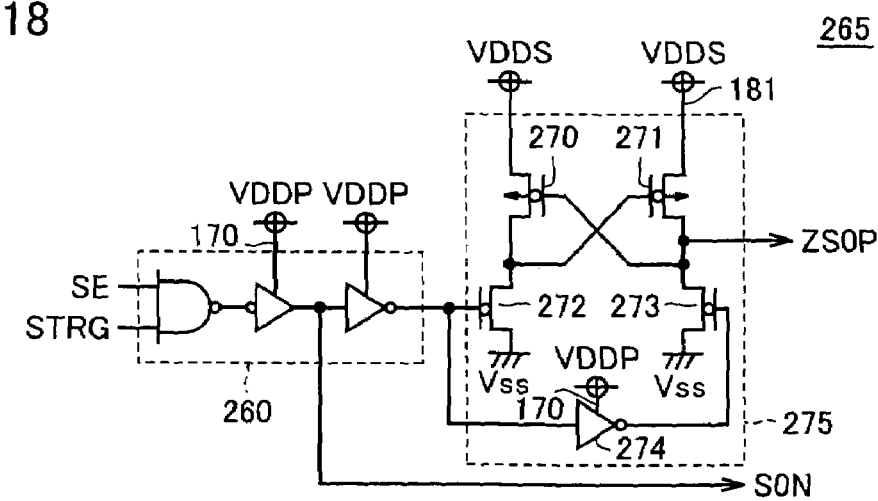
FIG. 18 is a circuit diagram showing a configuration of a sense power supply control circuit according to a fifth embodiment.

In the fifth embodiment, a configuration for preventing a through current produced during stand-by in the sense amplifier circuit in the burn-in test as above will be described. FIG. 18 is a circuit diagram showing a configuration of a sense power supply control circuit according to the fifth embodiment.

Referring to FIG. 18, a sense power supply control circuit 265 according to the fifth embodiment further includes a level conversion circuit 275, in addition to the components in conventional sense power supply control circuit 260 shown in FIG. 17. Level conversion circuit 275 includes p-channel MOS transistors 270, 271, n-channel MOS transistors 272, 273, and an inverter 274. Level conversion circuit 275 is constituted of small thickness transistors, similar to sense power supply control circuit 260.

In level conversion circuit 275, inverter 274 employs peripheral power supply voltage VDDP as the operating power supply voltage, while the sources of p-channel MOS transistors 270, 271 are connected to internal power supply line 181 supplying array power supply voltage VDDS. As level conversion circuit 275 has a general configuration, detailed description of the configuration and operation thereof will not be provided.

In the sense power supply control circuit according to the fifth embodiment, sense power supply control circuit 260 generates a signal indicating an operation period of the sense amplifier circuit and having peripheral power supply voltage VDDP as an amplitude. Level conversion circuit 275 converts the signal generated by sense power supply control circuit 260 to a signal having array power supply voltage VDDS as an amplitude, so as to generate sense control signal ZS0P.

According to such a configuration, the voltage of sense control signal ZS0P (H level voltage) when supply of the operating power supply voltage to the sense amplifier is cut off is set to array power supply voltage VDDS. Accordingly, in sense power supply circuit 250 shown in FIG. 16, while the sense amplifier circuit is not operating (during stand-by), the gate voltage of p-channel MOS transistor 155 can be set to array power supply voltage VDDS. As a result, even if the relation of magnitude between peripheral power supply voltage VDDP and array power supply voltage VDDS as described above is reversed, turn-off of transistor 155 is ensured and flow of through current 258 can be avoided.

As described above, according to the configuration in the fifth embodiment, the burn-in test can efficiently be conducted in a semiconductor memory device having a configuration suitable for lower power consumption and having different thicknesses of the gate insulating films of the transistors in the peripheral circuit and the array-relevant circuit.

Sixth Embodiment

In a sixth embodiment, a configuration of an efficient sense amplifier circuit suitable for lower power consumption in the semiconductor memory device having what is called a shared sense amplifier configuration will be described.

Figure 19:
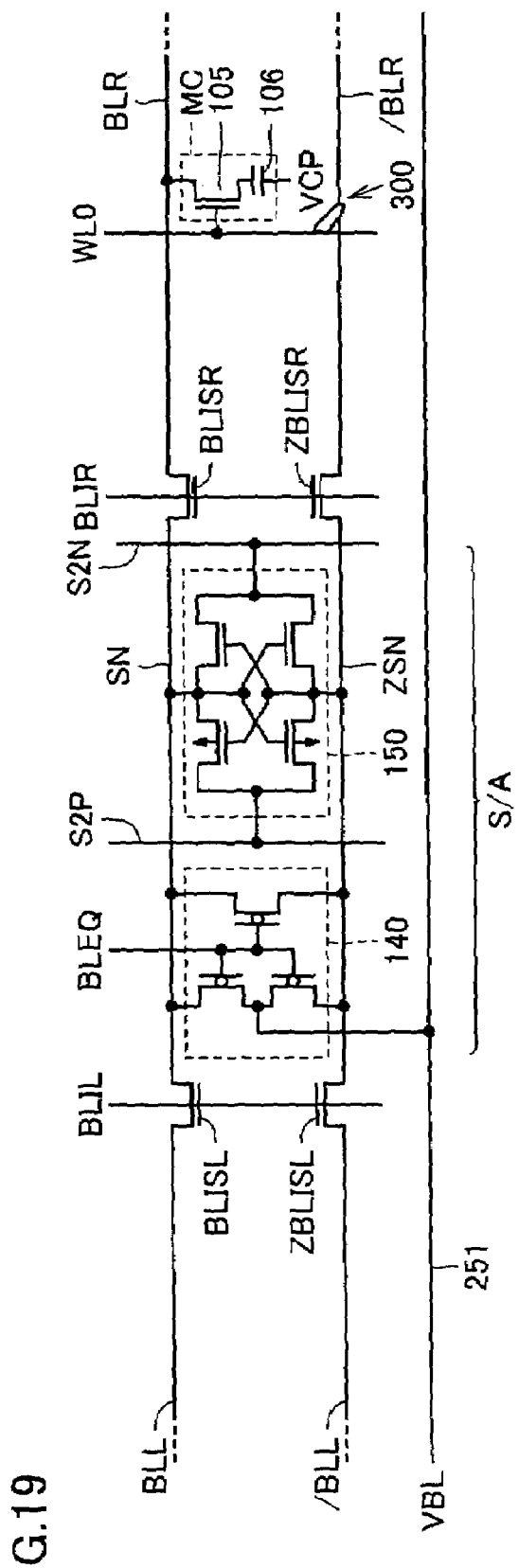
FIG. 19 is a circuit diagram illustrating a configuration of a general shared sense amplifier configuration shown as a comparative example.

FIG. 19 is a circuit diagram illustrating a configuration of a general shared sense amplifier configuration shown as a comparative example.

Referring to FIG. 19, in the general shared sense amplifier configuration, sense amplifier circuit S/A constituted of precharge/equalization circuit 140 and sense amplifier unit 150 shown in FIG. 3 is shared by bit lines BLL, /BLL arranged in a left area and bit lines BLR, /BLR arranged in a right area. That is, FIG. 19 shows a configuration corresponding to one memory cell column.

Bit line isolation switches BLISR and ZBLISR are provided between bit lines BLR, /BLR in the right area and sense amplifier circuit S/A, and bit line isolation switches BLISL and ZBLISL are provided between bit lines BLL, /BLL in the left area and sense amplifier circuit S/A.

As a single sense amplifier circuit S/A can be shared by the bit line pairs in the left and right areas, such a shared sense amplifier configuration is advantageous in terms of layout arrangement. In particular, in the configuration shown in FIG. 19, precharge/equalization circuit 140 is shared. Therefore, by setting both of bit line isolation signals BLIL and ZBLIL as well as equalization signal BLEQ to H level during stand-by, equalization of bit lines BLL, /BLL in the left area and bit lines BLR, /BLR in the right area is allowed.

In the configuration sharing precharge/equalization circuit 140 as above, however, if a defect such as short-circuit takes place between the bit line and other portion, the stand-by current is increased. For example, it is assumed that a conductive foreign matter 300 adheres between word line WL0 and bit line /BLR, resulting in occurrence of short-circuit. As a semiconductor memory device is increasingly made smaller recently, occurrence of such a defect as short-circuit tends to increase relatively.

Here, if a normal operation is disabled due to large short-circuit current caused by conductive foreign matter 300, a defective bit line is replaced by means of a redundancy circuit (not shown) including a spare memory cell so as to avoid using the same, thereby attaining a normal operation of the semiconductor memory device as a whole.

During stand-by in which all bit lines are precharged and equalized, however, if word line WL0 is set to the non-selected state (L level: ground voltage Vss), a short-circuit path due to conductive foreign matter 300 is connected not only to bit line /BLR but also to sense node ZSN and bit line /BLL in an opposite area sharing precharge/equalization circuit 140, which results in relatively large short-circuit current. Consequently, a specification value of the stand-by current is not satisfied under the specifications premised on mount to a portable instrument.

Figure 20:
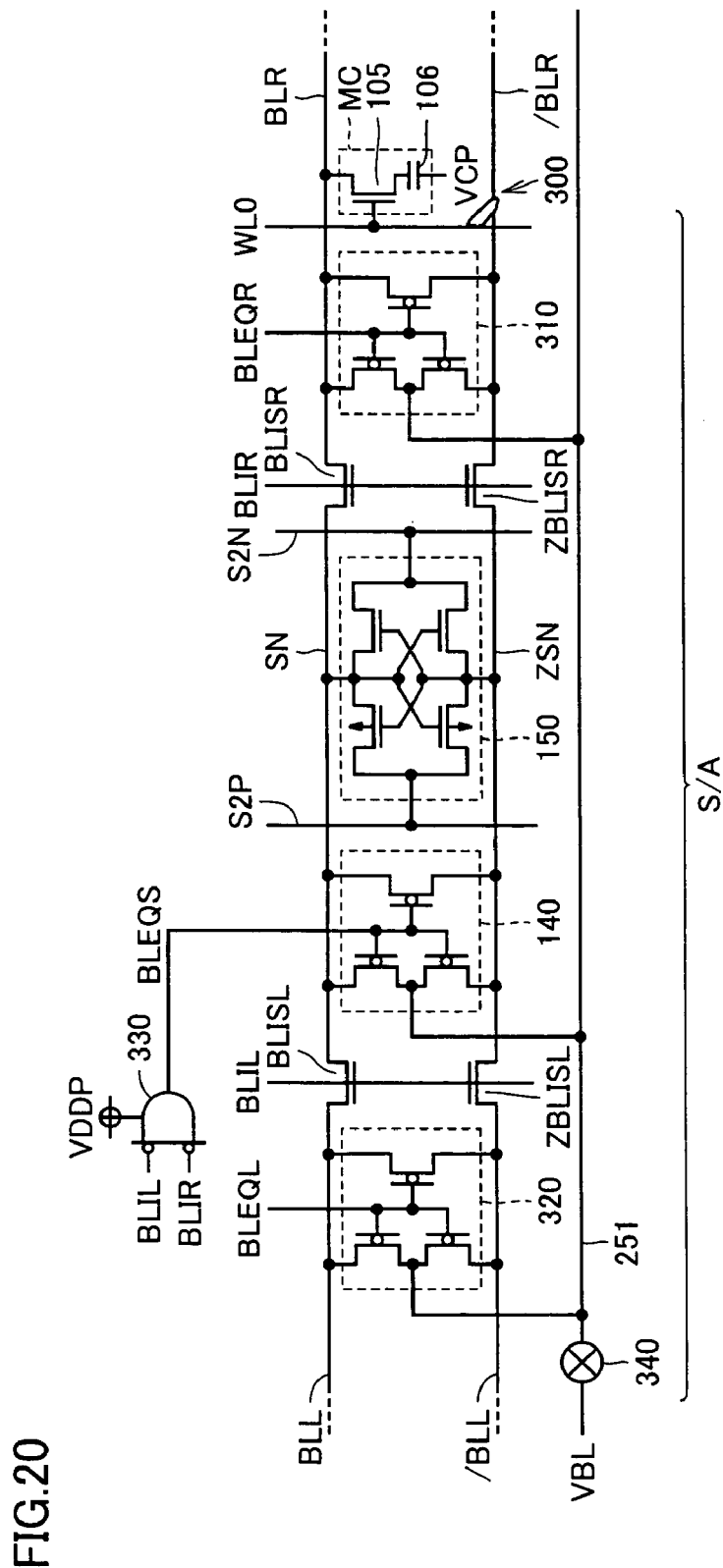
FIG. 20 is a circuit diagram showing a configuration of a sense amplifier circuit according to a sixth embodiment.

FIG. 20 is a circuit diagram showing a configuration of a sense amplifier circuit according to the sixth embodiment, for overcoming the problem described in connection with FIG. 19.

Referring to FIG. 20, the sense amplifier circuit according to the sixth embodiment is different from the configuration shown in FIG. 19 in that precharge/equalization circuits 310 and 320 are further provided in addition to precharge/equalization circuit 140.

Precharge/equalization circuit 310 is arranged outside bit line isolation switches BLISR, /BLISR, in order to precharge bit lines BLR, /BLR in the right area. Similarly, precharge/equalization circuit 320 is arranged outside bit line isolation switches BLISL, /BLISL, in order to precharge bit lines BLL, /BLL in the left area.

As the configuration of precharge/equalization circuits 310 and 320 is similar to that of precharge/equalization circuit 140, detailed description thereof will not be repeated. Precharge/equalization circuits 310 and 320 are also constituted of small thickness transistors, similarly to precharge/equalization circuit 140.

Precharge/equalization circuit 310 precharges and equalizes bit lines BLR, /BLR to bit line voltage VBL while an equalization signal BLEQR is at H level. Similarly, precharge/equalization circuit 320 precharges and equalizes bit lines BLL, /BLL to bit line voltage VBL while an equalization signal BLEQL is at H level.

According to such a configuration, even when bit line isolation signals BLIL, BLIR are set to L level and bit line isolation switches BLISL, ZBLISL and BLISR, ZBLISR are all turned off during stand-by, the precharge/equalization operation for bit lines BLL, /BLL in the left area, bit lines BLR, /BLR in the right area, and sense nodes SN, ZSN can be performed.

Therefore, even when short-circuit takes place in bit line /BLR due to conductive foreign matter 300 as in FIG. 19, bit lines BLL, /BLL in the left area and sense nodes SN, ZSN are disconnected from a source of leakage during stand-by, thereby reducing current consumption during stand-by.

In addition, VBL line 251 is branched corresponding to a unit of redundancy replacement, and a fuse 340 is provided for each branch. Accordingly, a defect that has turned out to be the source of leakage due to presence of conductive foreign matter 300 is replaced and repaired, and supply of bit line voltage VBL can be cut off. Thus, the stand-by current is further reduced. Here, a unit of arrangement of fuses 340 may be determined as required, considering a range, i.e., a unit of replacement by a redundancy circuit.

Moreover, in the configuration shown in FIG. 20, precharge/equalization circuits 140, 310 and 320 are provided independently of each other. Therefore, equalization signal BLEQL in the left area can be an inverted signal of bit line isolation signal BLIL, and similarly, equalization signal BLEQR in the right area can be an inverted signal of bit line isolation signal BLIR.

In this manner, precharge/equalization circuit 310 precharges and equalizes bit lines BLR, /BLR to bit line voltage VBL while bit line isolation switches BLISR, ZBLISR are turned off. Similarly, precharge/equalization circuit 320 precharges and equalizes bit lines BLL, /BLL to bit line voltage VBL while bit line isolation switches BLISL, ZBLISL are turned off.

In addition, logic gate 330 sets equalization signal BLEQS to H level while bit line isolation signals BLIL and BLIR are both at L level, and otherwise sets equalization signal BLEQS to L level. Precharge/equalization circuit 140 precharges and equalizes sense nodes SN, ZSN to bit line voltage VBL in accordance with equalization signal BLEQS output from logic gate 330.

In other words, logic gate 330 detects turn-off of all bit line isolation switches BLISL, ZBLISL and BLISR, ZBLISR based on bit line isolation signals BLIL and BLIR. Logic gate 330 precharges and equalizes sense nodes SN and ZSN in response to detection.

As described above, sense nodes SN and ZSN are precharged and equalized to bit line voltage VBL while bit lines BLL, /BLL and BLR, /BLR are all disconnected. On the other hand, when any of bit lines BLL, /BLL in the left area and BLR, /BLR in the right area is connected to sense amplifier circuit S/A, logic gate 330 sets equalization signal BLEQS to L level, so as to stop the precharge and equalization operation.

Therefore, equalization signals BLEQS, BLEQL, BLEQR can be generated in the vicinity of sense amplifier circuit S/A based on bit line isolation signals BLIL and BLIR.

Figure 21:
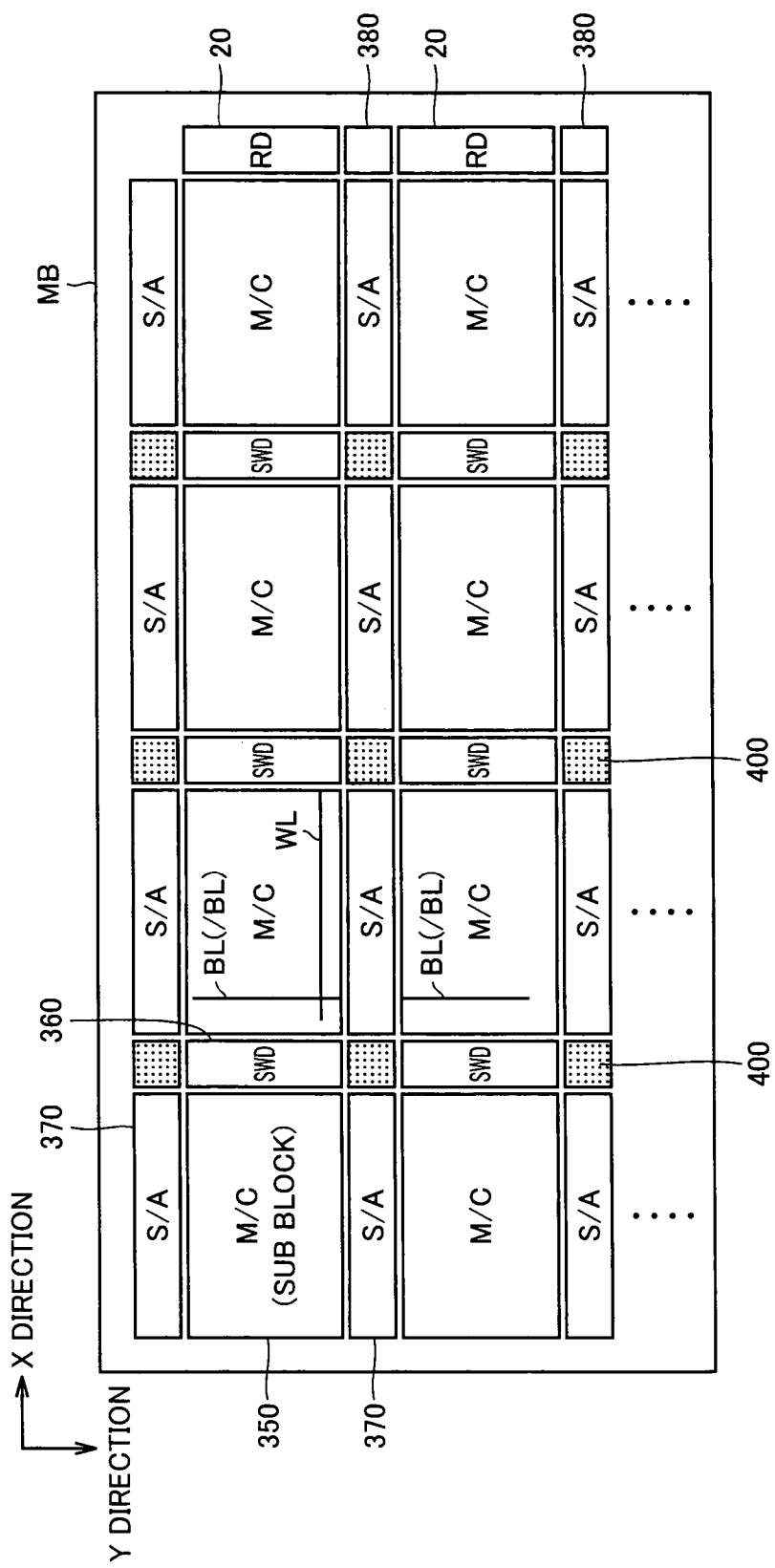
FIG. 21 is a block diagram schematically showing a configuration of a memory cell array in the shared sense amplifier configuration.

FIG. 21 is a block diagram schematically showing a configuration of a memory cell array in the shared sense amplifier configuration.

Referring to FIG. 21, in the memory cell array, a memory cell is arranged divided into a plurality of sub blocks 350. A sub word driver zone 360 is provided in an area adjacent to sub block. 350 in an X direction, and a sense amplifier zone 370 is provided in an area adjacent to the sub block in a Y direction. Though not shown, sense amplifier circuit S/A according to the shared sense configuration as shown in FIG. 20 is arranged in each sense amplifier zone 370, so as to correspond to each memory cell column. Each sense amplifier circuit is shared by bit lines in two adjacent sub blocks 350.

A word driver (not shown) selecting word line WL in each sub block 350 is arranged in sub word driver zone 360 based on a result of address decoding by row decoder 20 arranged at an end portion of the memory array. That is, a signal indicating the result of address decoding by row decoder 20 is transmitted to each sub word driver zone 360 through a signal line (not shown) along the X direction.

Similarly, at the end portion of the memory array, a sense amplifier control circuit 380 is arranged in an area adjacent to sense amplifier zone 370 in an X direction. Sense amplifier control circuit 380 includes sense power supply control circuit 265 (FIG. 18) generating sense control signals S0N, ZS0P shown in FIG. 18 or the like. Signals generated by sense amplifier control circuits 380 are transmitted to a plurality of sense amplifier zones 370 proximate in the X direction through a signal line (not shown) extending in the X direction.

In the configuration according to the sixth embodiment, though sense amplifier control circuit 380 further includes a circuit generating bit line isolation signals BLIL and BLIR, it is not necessary to generate an equalization signal instructing a precharge/equalization operation for the bit line and the sense node, that has conventionally been necessary. In other words, utilizing an area 400 lying between sense amplifier zones 370, an equalization signal generation portion generating equalization signals BLEQS, BLEQL, BLEQR shown in FIG. 20 can be arranged.

Figure 22:
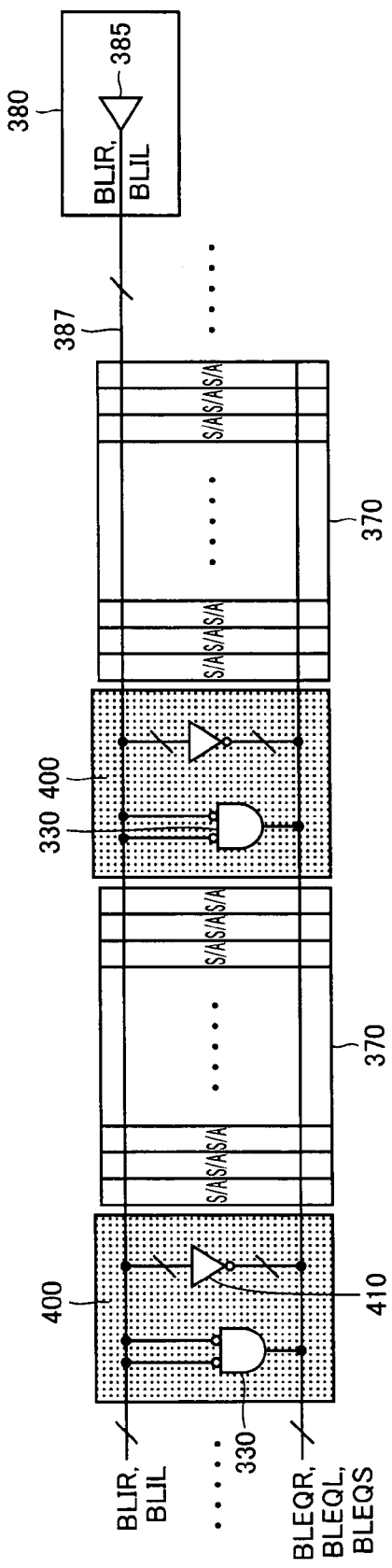
FIG. 22 is a conceptual diagram illustrating a layout of an equalization signal generation portion according to the sixth embodiment.

FIG. 22 is a conceptual diagram illustrating a layout of the equalization signal generation portion according to the sixth embodiment.

Referring to FIG. 22, bit line isolation signals BLIL, BLIR are generated by a drive portion 385 in sense amplifier control circuit 380, and transmitted through a signal line 387 arranged along the X direction. The equalization signal generation portion is constituted of an inverter 410 inverting bit line isolation signals BLIL, BLIR transmitted through signal line 387 to generate equalization signals BLEQL, BLEQR, and logic gate 330 for generating equalization signal BLEQS shown in FIG. 20.

According to such a configuration, generation of the equalization signal in sense amplifier control circuit 380 is no longer necessary, and the number of drive portions 385 can be reduced.

As signal line 387 is provided so as to cross the memory cell array, it covers a relatively long distance and its load capacity is also large. Accordingly, a transistor having high current drivability, that is, having a relatively large size, should be arranged in drive portion 385. Therefore, reduction in the number of drive portions 385 by reducing the number of control signals generated in sense amplifier control circuit 380 has a significant effect on reduction in an area of sense amplifier control circuit 380. In this manner, overall area of the memory array can be reduced.

As the first to fifth embodiments in the present invention are applicable without arrangement and configuration of the sense amplifier circuit being particularly limited, the first to fifth embodiments are also applicable to the shared sense amplifier configuration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a memory cell array having a plurality of memory cells arranged in rows and columns, a plurality of word lines arranged corresponding to said rows, and a plurality of bit line pairs arranged corresponding to said columns;
    a plurality of column selection lines provided corresponding to said columns;
    an address buffer receiving an address signal indicating selection from said rows and columns;
    a row decoder controlling a voltage of said plurality of word lines in accordance with said address signal received by said address buffer;
    a column decoder controlling a voltage of said plurality of column selection lines in accordance with said address signal received by said address buffer;
    a plurality of sense amplifiers provided corresponding to said plurality of bit line pairs and each amplifying a voltage difference on corresponding one of said bit line pairs;

a data line pair provided in common to said plurality of bit lines;
a plurality of column selection gates provided corresponding to said columns and each connecting corresponding one of said bit line pairs to said data line pair in accordance with a voltage of corresponding one of said column selection lines;
a first power supply system supplying an operating power supply voltage for said column decoder;
a second power supply system supplying an operating power supply voltage for said memory cell array and said plurality of sense amplifiers; and
a third power supply system supplying an operating power supply voltage for a peripheral circuit including said address buffer, wherein
said column decoder includes a plurality of column selection line drivers provided corresponding to said plurality of column selection lines,
each of said plurality of column selection line drivers has
a switching element connected between a first power supply node receiving a first voltage from said first power supply system and a first internal node, and turned on during operation of said column decoder and turned off during stand-by in response to a control signal,
a first connection control portion provided between said first internal node and a second internal node and connecting said second internal node to said first internal node in accordance with a result of selection of corresponding column of said columns, and
a second connection control portion provided between a second power supply node supplying a second voltage different from said first voltage and said second internal node,
said second connection control portion operates, in a manner complementary to said first connection control portion, so as to connect said second internal node to said second power supply node in accordance with the result of selection of said corresponding column, and
each of said plurality of column selection line drivers further includes a drive portion driving corresponding one of said column selection lines to one of said first and second voltages in accordance with a voltage of said second internal node.

2. The semiconductor memory device according to claim 1, wherein
said plurality of memory cells are arranged divided into a plurality of blocks,
a plurality of said column decoders are provided corresponding to said plurality of blocks, and
in each of said column decoders, said switching element is turned on or off in accordance with selection from said plurality of blocks.

3. A semiconductor memory device, comprising:
a plurality of memory cells arranged in rows and columns in first and second areas;
a word line arranged corresponding to each of said rows;
first and second bit line pairs arranged in said first and second areas respectively so as to correspond to each said column;
a sense amplifier circuit provided between said first and second areas so as to correspond to each said column and shared by said first and second bit line pairs; and
a sense amplifier control circuit generating signals controlling an operation of said sense amplifier circuit; wherein
said sense amplifier circuit includes
a sense amplifier unit amplifying a voltage difference between a sense node pair,
a first bit line isolation switch connected between said first bit line pair and said sense node pair and turned on or off in response to a first control signal generated by said sense amplifier control circuit,
a second bit line isolation switch connected between said second bit line pair and said sense node pair and turned on or off in response to a second control signal generated by said sense amplifier control circuit,
a first precharge/equalization circuit connecting said first bit line pair to a prescribed voltage when said first bit line isolation switch is turned off in response to an inverted signal of said first control signal,
a second precharge/equalization circuit connecting said second bit line pair to said prescribed voltage when said second bit line isolation switch is turned off in response to an inverted signal of said second control signal,
a logic circuit detecting turning off of both of said first and second bit line isolation switches based on said first and second control signals, and
a third precharge/equalization circuit connecting said sense node pair to said prescribed voltage in response to detection by said logic circuit.

4. The semiconductor memory device according to claim 3, wherein
a line supplying said prescribed voltage is branched corresponding to a unit of replacement and repair of a defective memory cell, and
said semiconductor memory device further includes a fuse for cutting off supply of said prescribed voltage for each branch of said line.

5. The semiconductor memory device according to claim 3, wherein
said plurality of memory cells are divided into a plurality of sub blocks aligned in rows and columns,
said sense amplifier circuit is arranged in an area between said sub blocks adjacent in a direction along said bit line pair,
said semiconductor memory device further includes a word line drive circuit arranged in an area between said sub blocks adjacent in a direction along said word line,
said first and second control signals are transmitted from said sense amplifier control circuit arranged in a peripheral area of said plurality of memory cells to said sense amplifier circuit via a signal line provided in the direction along said word line, and
an inverter generating the inverted signals of said first and second control signals and said logic circuit are arranged in an area lying between said word line drive circuit and said sense amplifier circuit.

* * * * *

UNITED STATES PATENT AND TRADEMARK OFFICE
CERTIFICATE OF CORRECTION

PATENT NO.       : 7,102,935 B2  
APPLICATION NO.  : 10/972537  
DATED            : September 5, 2006  
INVENTOR(S)      : Takeo Miki et al.

Page 1 of 1

It is certified that error appears in the above-identified patent and that said Letters Patent is hereby corrected as shown below:

TITLE Page
   Item "(56) References Cited", under "U.S. PATENT DOCUMENTS", insert -- 5,814,851   9/1998      Suh…………..257/296 --;

And under "FOREIGN PATENT DOCUMENTS", below last JP listing, insert

-- KR   1997-0012728      8/1995 --.

Signed and Sealed this

Twelfth Day of August, 2008

JON W. DUDAS  
*Director of the United States Patent and Trademark Office*